United States Patent [19]

Cooke et al.

[11] Patent Number: 5,313,119
[45] Date of Patent: May 17, 1994

[54] FIELD PROGRAMMABLE GATE ARRAY

[75] Inventors: Laurence H. Cooke, San Jose; David Marple, Palo Alto, both of Calif.

[73] Assignee: Crosspoint Solutions, Inc., Santa Clara, Calif.

[21] Appl. No.: 783,659

[22] Filed: Oct. 28, 1991

Related U.S. Application Data

[63] Continuation-in-part of Ser. No. 671,222, Mar. 18, 1991, abandoned.

[51] Int. Cl.⁵ .................. H03K 19/173; H03K 19/094
[52] U.S. Cl. ................................ 307/465.1; 307/465; 307/468
[58] Field of Search ...................... 307/465, 465.1, 468, 307/469, 202.1, 443; 364/716

[56] References Cited

U.S. PATENT DOCUMENTS

| | | |
|---|---|---|
| 4,495,629 | 1/1985 | Zasio et al. . |
| 4,591,993 | 5/1986 | Griffin et al. ........................ 307/469 |
| 4,609,830 | 9/1986 | Brandman . |
| 4,642,487 | 2/1987 | Carter . |
| 4,644,187 | 2/1987 | Haji .................................... 307/468 |
| 4,682,202 | 7/1987 | Tanizawa ............................ 307/469 |
| 4,689,654 | 8/1987 | Brockmann . |
| 4,758,745 | 7/1988 | Elgamal et al. . |
| 4,786,904 | 11/1988 | Graham, III et al. . |
| 4,853,562 | 8/1989 | Yamada .............................. 307/469 |
| 4,857,774 | 8/1989 | El-Ayat et al. . |
| 4,870,302 | 9/1989 | Freeman . |
| 4,873,459 | 10/1989 | El Gamal et al. . |
| 4,910,417 | 3/1990 | El Gamal et al. . |
| 4,933,576 | 6/1990 | Tamamura et al. .................. 307/465 |
| 4,935,734 | 6/1990 | Austin . |
| 5,001,368 | 3/1991 | Cliff et al. . |
| 5,015,885 | 5/1991 | El Gamal et al. . |
| 5,083,083 | 1/1992 | El-Ayat et al. . |
| 5,166,556 | 11/1992 | Hsu et al. ............................ 307/469 |
| 5,172,014 | 12/1992 | El Ayat et al. ...................... 307/465 |
| 5,187,393 | 2/1993 | El Gamal et al. ................... 307/465 |

Primary Examiner—Edward P. Westin
Assistant Examiner—Richard Roseen
Attorney, Agent, or Firm—Townsend and Townsend Khourie and Crew

[57] ABSTRACT

A FPGA matching the organization and performance of mask programmable gate arrays is presented. The core array is organized into rows of continuous series transistors (CSTs) and rows of small latch/logic blocks. The source/drains and gate of each of the transistors are connected to line segments. The input and output terminals of the blocks are also connected to line segments. Programmable antifuses are located at the intersections of the line segments, which also include others for power and routing purposes. The FPGA can be efficiently configured into a user's application with the flexibility of the CSTs and the efficiency of the latch-/logic blocks, which may also be configured into RAM arrays.

42 Claims, 30 Drawing Sheets

D FLIP-FLOP WITH CLEAR

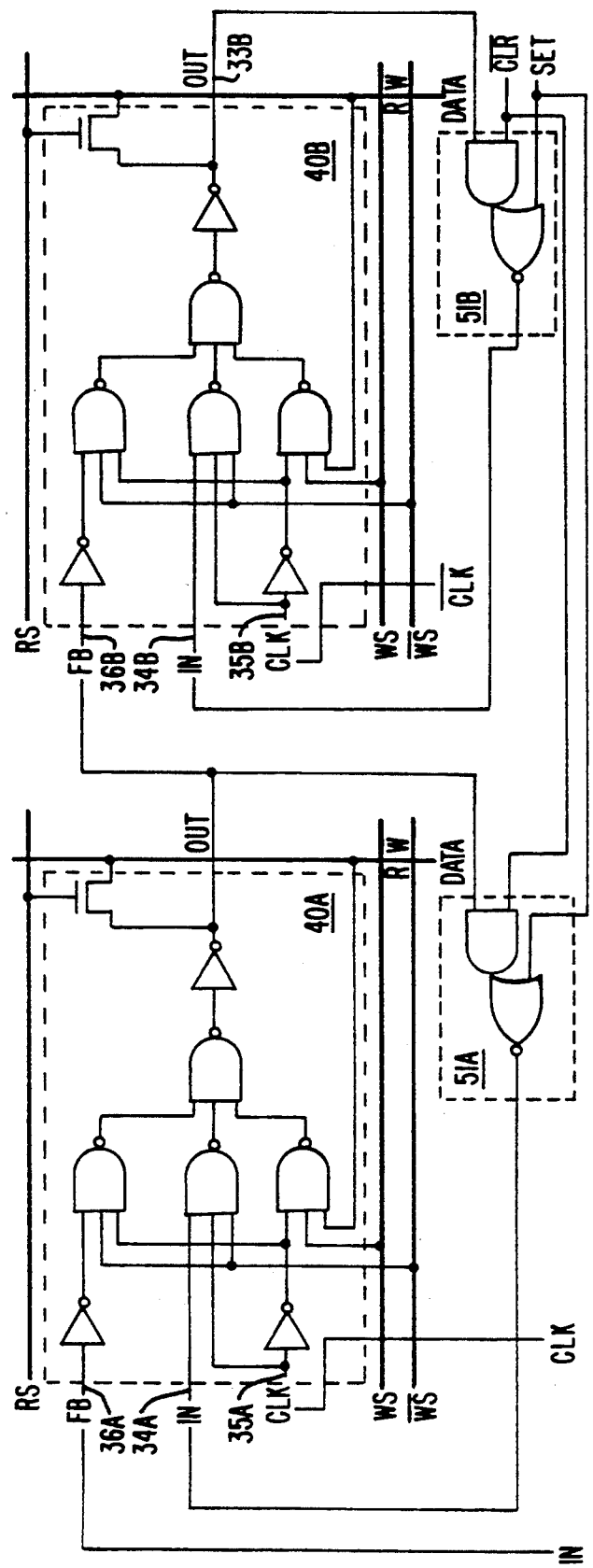
FIG. 6E. D FLIP-FLOP WITH SET AND CLEAR

DECODE STRUCTURE
  4 LATCH. SEGMENTS (L1-L4)
  4 P SOURCE/DRAIN. SEGMENTS (PD1-PD4)
  4 N SOURCE/DRAIN. SEGMENTS (ND1-ND4)
  4 P GATE. SEGMENT (PG1-PG4)
  4 N GATE. SEGMENT (NG1-NG4)
  2 LOCAL CHEVRON. SEGMENTS (LC1 & LC2)
  2 VERTICAL CHEVRON. SEGMENTS (VC1 & VC2)
  8 TRACK. SEGMENTS (T1-T8)

32 N AND 32 P PROGRAMMING TRANSISTORS/4 TILES

*FIG. 12A.*

FOR UPPER DECODE GROUP
8 GRIDS AND 8 DECODE GATES (4 N AND 4 P)
P-CHANNEL PROGRAMMING (FOR EACH +X)

| GRID    | +Y1 | +Y2 | +Y3 | +Y4 |
|---------|-----|-----|-----|-----|
| +GRID 1 | PG1 | T2  | L3  | PD4 |
| +GRID 2 | PD1 | PG2 | T3  | L4  |
| +GRID 3 | L1  | PD2 | PG3 | T4  |
| +GRID 4 | T1  | L2  | PD3 | PG4 |

N-CHANNEL PROGRAMMING (FOR EACH -X)

| GRID    | -Y1 | -Y2 | -Y3 | -Y4 |
|---------|-----|-----|-----|-----|
| -GRID 1 | PG1 | T2  | L3  | PD4 |
| -GRID 2 | PD1 | PG2 | T3  | L4  |
| -GRID 3 | L1  | PD2 | PG3 | T4  |
| -GRID 4 | T1  | L2  | PD3 | PG4 |

*FIG. 12B.*

FOR THE LOWER DECODE

8 GRIDS AND 8 DECODE GATES (4N AND 4P)

P-CHANNEL PROGRAMMING (FOR EACH +X)

| GRID | +Y1 | +Y2 | +Y3 | +Y4 |
|---|---|---|---|---|
| +GRID 5 | NG1 | T6 | VC2 | ND4 |
| +GRID 6 | ND1 | NG2 | T7 | LC2 |
| +GRID 7 | VC1 | ND2 | NG3 | T8 |
| +GRID 8 | T5 | LC1 | ND3 | NG4 |

N-CHANNEL PROGRAMMING (FOR EACH -X)

| GRID | -Y1 | -Y2 | -Y3 | -Y4 |
|---|---|---|---|---|
| -GRID 5 | NG1 | T6 | VC2 | ND4 |
| -GRID 6 | ND1 | NG2 | T7 | LC2 |
| -GRID 7 | VC1 | ND2 | NG3 | T8 |
| -GRID 8 | T5 | LC1 | ND3 | NG4 |

*FIG. 12C.*

FIELD PROGRAMMABLE GATE ARRAY

BACKGROUND OF THE INVENTION

This patent application is a continuation-in-part of U.S. Ser. No. 07/671,222, filed Mar. 18, 1991, now abandoned.

The invention relates generally to the field of semiconductor devices, particularly to gate arrays and, more particularly, to user-programmable or field programmable gate arrays (FPGAs).

A gate array, a type of integrated circuit device, is largely a matrix of circuit elements, such as transistors, logic gates and their associated input and output circuits. These circuit elements are overlaid with one or more interconnection layers, which connect the transistors, logic gates and the input and output circuits in a pattern to perform a user-specified function.

Conventional, or mask-programmable, gate arrays (MPGAs) are created by building the integrated circuit up to the interconnect level. After the interconnect pattern is specified by the user, the wiring channels are created by depositing, masking, and etching the metal interconnection layers and contact layers to make the connections for the desired logic cells and the input and output circuits to perform the user-specified function. The creation of the wiring channels, i.e., the programming of the device, is done by the manufacturer of the MPGA.

However, disadvantages of MPGAs include the long period between the design and specification of the desired interconnect pattern and the receipt of the completed device, plus the large nonrecurring engineering cost involved in each design and specification iteration. These disadvantages make MPGAs uneconomical in small production volumes.

Another type of gate array, the field programmable gate array (FPGA), address some of these problems. The FPGA is completely formed with a global set of vertical and horizontal wiring channels which are built into the device. However, these channels are electrically isolated from the logic cells, the input and output circuits, and each other, by electrically programmable interconnect elements. One such element is an antifuse. The user programs these antifuses to define the specified interconnection pattern for the user's application, very rapidly and at the user's own facility. The elapsed time from design specification to receipt of completed parts is measured in minutes instead of months. The nonrecurring engineering cost is also avoided.

However, FPGAs heretofore have had certain disadvantages in performance and use with respect to MPGAs. In a MPGA the programmable transistors are arranged in either small units of transistors, typically 4 or 6 transistors, which are electrically tied together into a functioning cell, or into an array of series-connected transistors (sometimes called continuous-series transistors, or CSTs) in which the source/drain of one MOS transistor merges into the source/drain of a neighboring MOS transistor. In both cases the metal interconnection lines of the MPGA connect various nodes of the units or the series-connected transistors to configure the units or transistors into various logic gate cells or larger logic blocks, as desired by the specific application.

Instead of these small units and individual transistors, present day FPGAs use arrays of configurable logic blocks which have many transistors. This type of organization is inefficient in implementing small logic gates and inverters, of which a large percentage exist in MPGA designs. The large logic blocks of present day FPGAs provide poor gate utilization and operate at speeds too slow for designs using MPGA logic methodology.

Furthermore, these FPGAs, once programmed, do not behave like an identically-programmed MPGA. Because of the large numbers of users already familiar with the architecture and usage of MPGAs, it is desirable that the FPGA match a MPGA in gate density and performance.

The present invention offers a FPGA which is not only compatible with MPGAs, but also has performance levels comparable to that of a MPGA. In doing so, the present invention solves or substantially mitigates many of the problems of present day FPGAs.

SUMMARY OF THE INVENTION

In an FPGA according to the present invention, the programmable array has rows of continuous-series transistors (CST) interleaved with rows of small latch/logic blocks (LLB). Wiring channels are interleaved between the CST and LLB rows.

Each source/drain and gate of each MOS transistor of each CST row is connected to a wiring segment. These segments are arranged perpendicularly to the rows. Each LLB is connected to wiring segments which are also perpendicular. Wiring segments in the channels run parallel with the rows. Other wiring segments have portions which run parallel to the rows.

At the intersections of these parallel and vertical wiring segments are antifuses, which when programmed, electrically connect the intersecting segments. The two intersecting wiring segments for a particular antifuse are driven to large programming voltages so that a large voltage occurs across the antifuse to program the antifuse. Each wiring segment is connected to large programming transistors which can drive the segment to the programming voltages. Selection of the particular wiring segment is performed by addressing a plurality of programming transistors, but only one of the programming transistors is connected to a programming voltage power supply. In this manner some savings in space is achieved.

To configure the CST and LLB rows, the various antifuses must be programmed to make the desired connections between the wiring segments. Rules and sequences for properly programming the antifuses are followed.

The CST rows offer the fine grain configurability of an MPGA with performance nearly matched to MPGAs. The LLB rows offer the high efficiency of multiplexer-based logic blocks for implementing multiplexer-intensive cells, such as multiplexers, latches, flip-flops, EXCLUSIVE-NOR (XNOR) logic gates, and adders. In addition, the LLB rows can be used to assemble moderately sized static random access memory (RAM) blocks provides a highly flexible, extremely efficient base for implementing any user application.

BRIEF DESCRIPTION OF THE DRAWINGS

FIG. 6E illustrates how two LLBs may be configured as a D flip-flop with Set and Clear control signals.

FIG. 12B is a table of wiring segments in the upper portion of a four-tile section in a CST row being addressed by $\pm Y$ and $\pm X$ grid decoding for programming;

FIG. 12C is a table of wiring segments in the lower portion of a four-tile section in a CST row being addressed by $\pm Y$ and $\pm X$ grid decoding for programming.

FIG. 12A is a decode structure reference for FIGS. 12B and 12C.

DESCRIPTION OF THE PREFERRED EMBODIMENT(S)

The antifuse, which forms the base of all FPGAs, is a programmable element which is placed between two conducting layers of the FPGA integrated circuit. The type of antifuse contemplated in the present invention has a high resistance of several giga-ohms in the unprogrammed, or "off," state and a low resistance, say, 100–150 ohms, in the programmed, or "on," state. The unprogrammed antifuses have a very low parasitic capacitance, below 2 fF.

Programming of the antifuse is performed by applying programming voltages, $V_{pp}$ and $V_{ss}$, to create a large voltage across the antifuse for a period of time, typically fractions of a second. The large programming voltage breaks down the material across the antifuse and the following sustained heavy current changes the antifuse to a low resistance state.

A specific example of an antifuse useful in the present invention is a structure made of amorphous silicon which fits into a normal contact between a metal 1 layer and a polysilicon layer. This structure is disclosed in U.S. Pat. No. 4,796,074, issued to B. Roesner on Jun. 3, 1989. Another useful antifuse structure is formed between any two metal interconnection layers of an integrated circuit. This structure is disclosed in U.S. patent application, Ser. No. 07/642,617, entitled, "AN IMPROVED ANTIFUSE CIRCUIT STRUCTURE FOR USE IN A FIELD PROGRAMMABLE GATE ARRAY AND METHOD OF MANUFACTURE THEREOF," filed by M. R. Holdzworth et al. on Jan. 17, 1991, and assigned to the present assignee.

Figure 1:
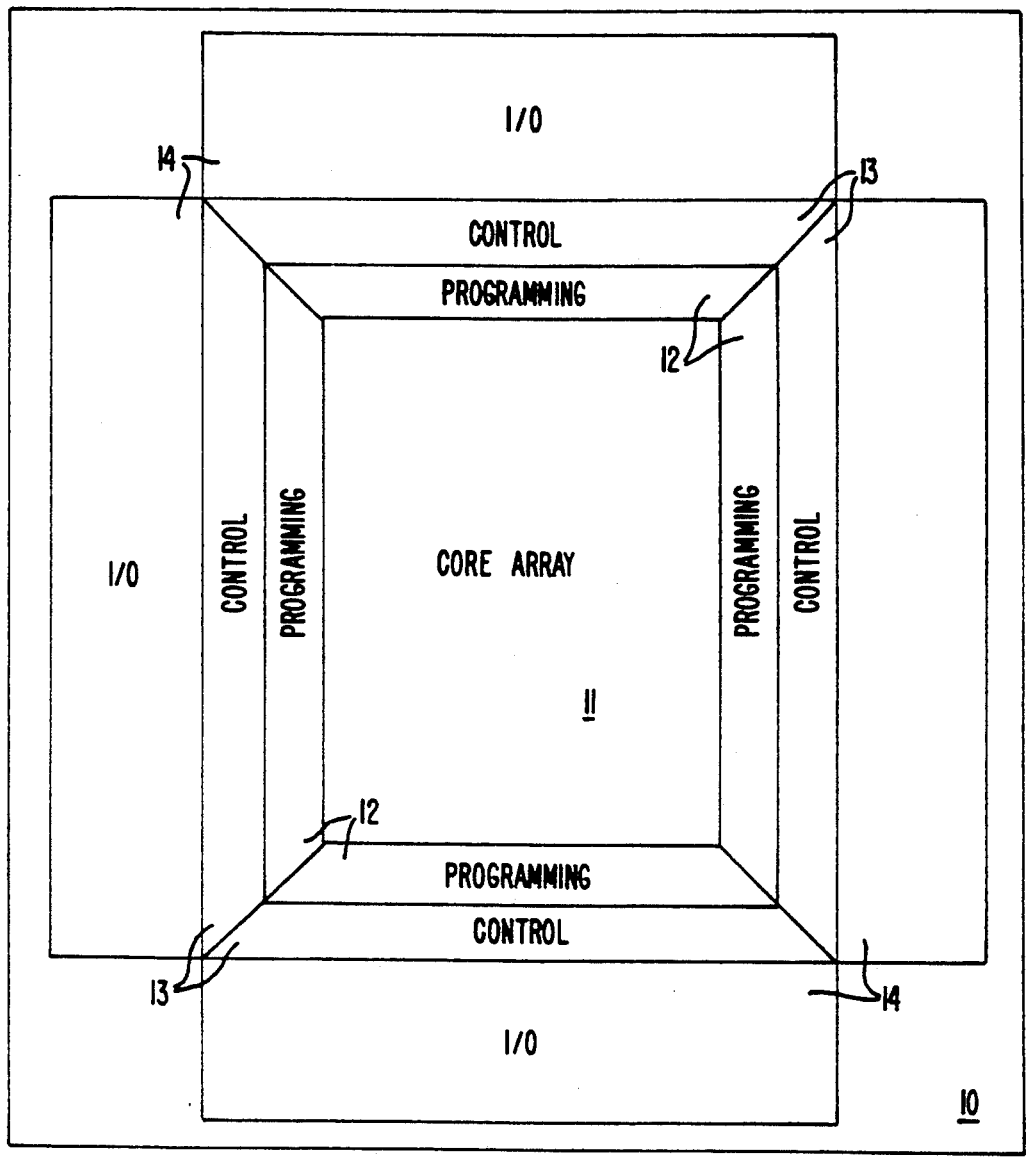
FIG. 1 is a general top view of an integrated circuit implementing the present invention.

A top view of an field programmable gate array (FPGA) integrated circuit implementing the present invention is illustrated in FIG. 1. The drawing shows the general organizational layout of the FPGA.

On a semiconductor substrate 10 the FPGA has a central core array section 11, which contains the continuous-series transistors (CST), latch/logic blocks (LLB) and antifuses which are programmed to configure the transistors and blocks for the user's application.

Surrounding the core array section 11 is a section 12, here shown as four separate areas, which contain the circuits for programming the antifuses in the core array 11. Included in this section 12 is circuitry for controlling the special programming voltages, $V_{pp}$ and $V_{ss}$, for programming the antifuses. On the outside of this programming section 12 is a control section 13, again shown as four separate areas, which contains the control circuitry used for addressing the wiring segments in programming the selected antifuses.

Finally, an input/output section 14 is located on the periphery of the substrate 10. The section 14 contains the input and output circuitry for receiving signals from the outside world into the FPGA interior and for driving signals from the interior of the FPGA to the outside world.

The Core Array

Figure 2:
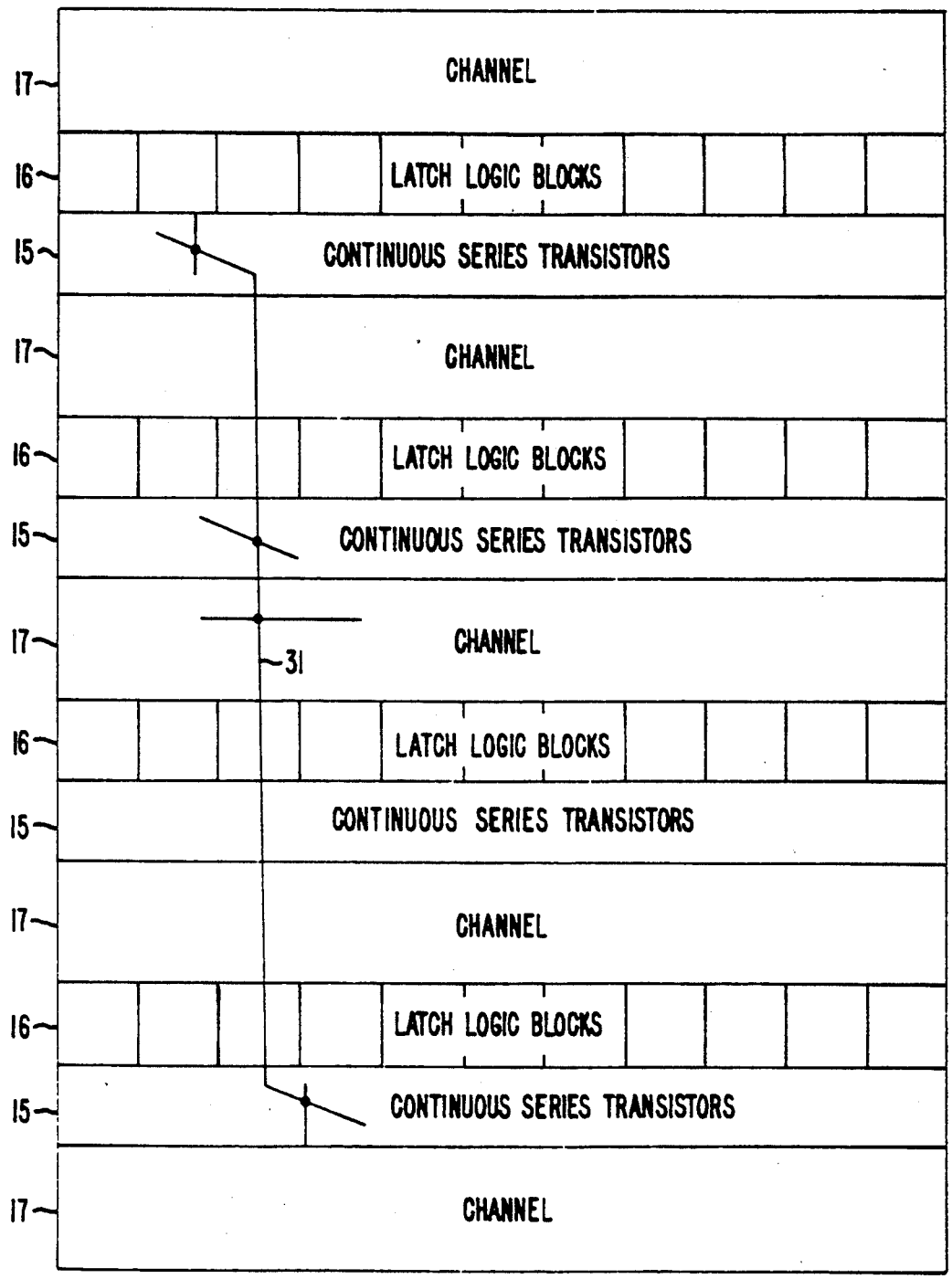
FIG. 2 is a general top view of the core array of the integrated circuit of FIG. 1.

FIG. 2 shows a representational view of the FPGA core array 11. The array 11 has horizontal CST rows 15 and LLB rows 16 which are interleaved with horizontal wiring channels 17 between the CST and LLB rows 15 and 16. The CST rows 15 are used to implement different logic cells, from standard drive to high drive inverters, from multiple input NAND and NOR gates, to more complex AOI (AND-or-invert) cells. These rows 15 can also implement multiplexer-based logic cells. However, the adjacent LLB rows 16, each of which contains a row of preconfigured logic blocks as indicated by the vertical lines in the rows 16, are more efficient for implementing such cells.

In the rows 15 and 16 and channel 17 are horizontal and vertical wiring segments. At the intersection of many of the segments are antifuses, which, when programmed, electrically connect intersecting segments together. These antifuses are located mostly at the intersection of the wiring segments in the CST rows 15 and the channels 17. The CST rows 15 can be flexibly configured into the desired logic cells and the channels 17 can make the required intercell connections.

Thus cell functions and circuit connections are defined by programming the appropriate antifuse element which then forms a low resistance connection between intersecting horizontal and vertical wiring segments. The CST rows 15 and LLB rows 16 are logically and interconnectedly configurable and can implement nearly any combinatorial logic or storage logic cell possible in present MPGAs. This is discussed in more detail below.

The Wiring Channels and Vertical Routing

For purposes of explanation, some terms are now defined. The term "column" is used to indicate a vertical slice in the core array 11 having a width occupied by an opposing pair of transistors, i.e. a PMOS and a NMOS transistor, in a CST row 15. The term "tile" refers to that portion of a column in a CST row 15.

Broadly speaking, the wiring channels 17 are used to make the horizontal connections between the configured cells in the CST rows 15 and the LLB rows 16. The channels 17, which are interleaved with the CST rows 15 and LLB rows 16, contain horizontal segmented wiring tracks of different segment lengths. These horizontal wiring track segments vary from a minimum length of eight columns to the entire width of the array 11. The different segments lengths serve different purposes and increase the utility of the channels 17. For example, the horizontal segments which minimally span eight columns primarily are used to make feedback connections to the latch/logic blocks in the LLB rows 16 to configure the blocks into latches, flip-flops, and RAM cells, as explained below.

Included within each channel 17 are also clock lines to be used as global clock signals, global enable or reset signals, or any other high fanout signal in the user's application. The clocks are driven from driver circuits along the sides of each channel 17 of the array 11.

Intersecting the horizontal segments in the channels 17 are vertical wiring segments to accommodate vertical connections between circuit nodes in the CST rows 15 and LLB rows 16. Antifuse elements, indicated by a square at the intersection of two lines in the drawings of this patent application, are located at the intersections of the horizontal and vertical wire segments in the channel 17. Each channel 17 is a grid of horizontal and vertical wiring segments which have an antifuse at nearly every intersection.

Three types of vertical wiring are used in the core array 11. The first type is formed by a segment connected to a PMOS or NMOS transistor gate or a latch segment. Both are described in more detail below with respect to FIG. 3. This type of vertical segment forms a route from a horizontal wire segment in an adjacent channel 17 to the cell in the CST row 16 or LLB row 15.

The second type of vertical wiring is a vertical chevron. As illustrated in FIG. 2, each of these vertical wiring segments 31 span four CST rows 15 and intervening LLB rows 16. The chevrons 31 start and end on the CST rows 15. The term "chevron" is used because these wiring segments have a diagonal wire portion (or half chevron) in the rows 15 in which the vertical chevrons 31 start and end. The diagonal wire portions horizontally span five tiles. The central vertical portion of each vertical chevron passes through three wiring channels 17 and two rows 15. As symbolically indicated in FIG. 2, each vertical chevron 31 may be connected through antifuses along either diagonal end portion to vertical segments in the rows 15 or along the center portion of the segment 31 which passes through the channels 17 and rows 15 to horizontal segments in the channels 17 and rows 15. In passing, it should be noted that the horizontal segments in the rows 15 are actually diagonal.

Figure 3:
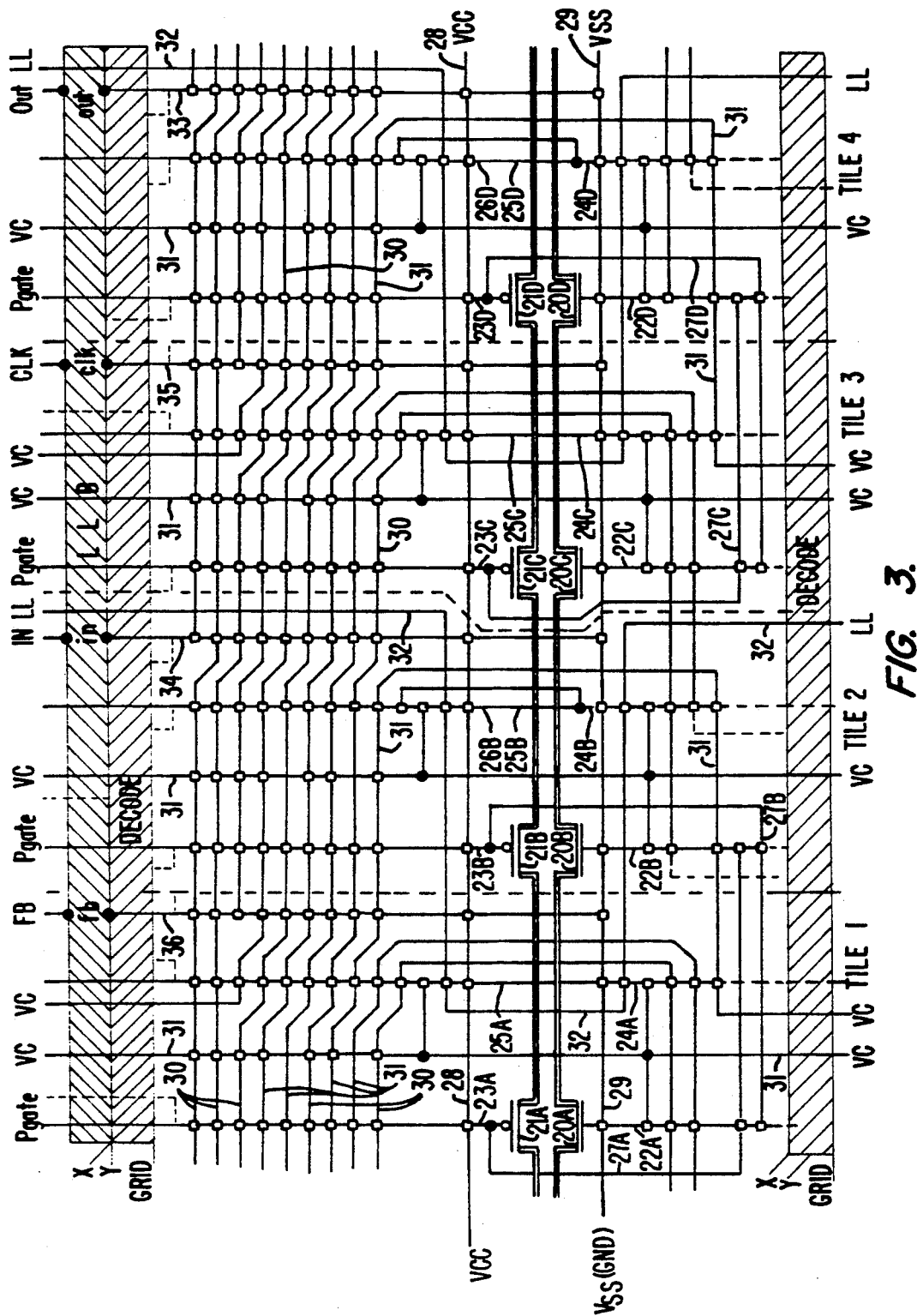
FIG. 3 is a detailed view of a CST row in the core array in FIG. 2.

FIG. 3 described below with respect to the CST row 15 also shows how the vertical chevrons 31 are mapped on to the core array 11. The pattern is regular and repeats horizontally every four tiles and vertically every row 15. A full vertical chevron exists for every two tiles, with a diagonal segment every tile. Two vertical chevrons feed through every two CST tiles and end on different rows.

The third type of vertical wiring segment is a long line. Long lines extend long distances from the top to the bottom of the core array to make long vertical connections primarily. Generally these wiring segments extend either the entire distance, $\frac{1}{2}$ the distance, or $\frac{1}{3}$ ($\frac{2}{3}$) the distance of the core array height. Long lines are horizontally spaced so that a long line passes through a CST row 15 every two tiles. These line segments are lightly loaded since they are intended to be used to route signals over long distances. The primary means for driving a long line is with a standard or high drive inverter.

The CST Row

The CST rows 15 offer the configurability of a MPGA with nearly matching performance. Small logic gates, such as NAND, NOR, AND, OR and inverters, are efficiently configured in the CST rows 15. Each of the transistors in the rows 15 have wiring segments connected to its source/drain s and gate electrode. Other wiring segments travel to different parts of the core array. All of these wiring segments intersect with each other and antifuses are placed between these intersecting segments. By programming selected antifuses, the transistors of the CST rows 15 may be configured into the desired block.

FIG. 3 illustrates the arrangement of a portion of a CST row 15 and related wiring segments. Each row 15 contains two strings of continuous-series transistors with one string formed from NMOS transistors and the other with PMOS transistors. In the drawings a PMOS transistor is denoted by a circle on the gate of the MOS transistor symbol. Furthermore, in FIG. 3 the merging of the source/drain of one CST transistor into the source/drain of another transistor is indicated by the double line connecting the source/drains of the transistors.

Four NMOS transistors 20A-20D and four PMOS transistors 21A-21D are shown. It should be understood that these transistors 20A-20D and 21A-21B are connected by their source/drains to other transistors in the row 15 which are not shown in the drawing.

Each of the gates of the NMOS transistors 20A-20D are connected to N gate wiring segments 22A-22D. Correspondingly, P gate wiring segments 23A-23D are respectively connected to each of the gates of the P transistors 21A-21D. These wiring segments 22A-22D and 23A-23D are run perpendicularly, or vertically, with respect to the alignment of the CST transistors 20A-20D and 21A-21D.

Wiring segments 24A-24D and 25A-25D are also connected to the respective source/drains (SD) of the NMOS and PMOS transistors 20A-20D and 21A-21D. For illustrative and labelling purposes, in FIG. 3 the source/drain to the right of each MOS transistor 20A-20D and 21A-21D is associated with the transistor. Thus each NMOS transistor 20A-20D has N SD wiring segments 24A-24D respectively connected to the source/drain of each NMOS transistor and each PMOS transistor 21A-21D has P SD wiring segments 25A-25D respectively connected to the source/drain of each PMOS transistor. These SD wiring segments 24A-24D and 25A-25D also run vertically. All the P gate and P SD segments 22A-22D and 24A-24D can be connected to a $V_{cc}$ power supply wire 28 running along the length of each CST row 15. Likewise, all N gate and N SD segments 23A-23D and 25A-25D can be connected to a $V_{ss}$ power supply wire 29 running along the length of each CST row 15. As in most CMOS integrated circuits, $V_{cc}$ is at +5 volts and V is at ground, or 0 volts, but other voltages could be used.

All P gate segments 22A-22D and latch segments 33-36, which are connected to input and output terminals of the LLBs 40, discussed below, extend up into the channel 17 above and have connections to all wiring segments in the channel.

Running diagonally are an array of wiring segments 30 and 31. One half of these segments are vertical chevrons 31, mentioned previously, used for intercell routing. The other half are local chevrons 30 for intracell routing. The local chevrons 30 horizontally span nine tiles of a CST row 15. There is one local chevron 30 horizontally for every two tiles. The vertical chevrons 31 horizontally span five tiles and there is one diagonal portion of a vertical chevron 31 for each tile. The local and vertical chevrons 30 and 31 intersect the P gate wiring segments 22A-22D, P SD segments 24A-24D, vertical sections of vertical chevrons 31 from CST rows above and below, and latch segments. The latch segments, along with the P gate segments, are wiring segments which run from a CST row 15 through a LLB row 16 to the channel 17 above. In FIG. 3 latch segments 33, 34, 35 and 36, labeled respectively (Data) OUT, (Data) IN, CLK (Clock) and FB (FeedBack), are shown. The vertical wiring long line 32, mentioned previously for distant intercell connections, is also shown.

The chevrons 30 and 31 also bridge the PMOS transistors 20A-20D and NMOS transistors 21A-21D, and horizontally span two of the N SD segments 25A-25D. The chevrons 30 and 31 span is longer on the PMOS transistor side than on the NMOS side because for the particular embodiment being discussed, the chevrons 30 and 31 are formed from metal on the P side and from more resistive polysilicon on the N side.

Even without the local and vertical chevrons 30 and 31, directly opposing N SD segments 25A-25D and P SD segments 24A-24D may also be fused together with special SD crossover segments 26B and 26D. These segments 26B and 26D are used primarily to implement inverter and pass gate circuits.

The N gate segments 23A-23D and the P gate segments 22A-22D also have special gate crossover segments 27A-27D, which may connect not only directly opposing gate segments, but also gate segments to the immediate left or right. The gate segment crossover segments 27A-27D connected to directly opposing gate segments 22A-22D and 23A-23D are the primary means for connecting the N gate segments 23A-23D for the signal input line for nearly all configured logic cells. The crossover segments 27A-27D connected to the gate segments to the immediate right or left are typically used to implement multiplexer-based blocks in the row 15, although the LLBs, discussed below, may better implement such multiplexer-based cells.

Figure 4A:
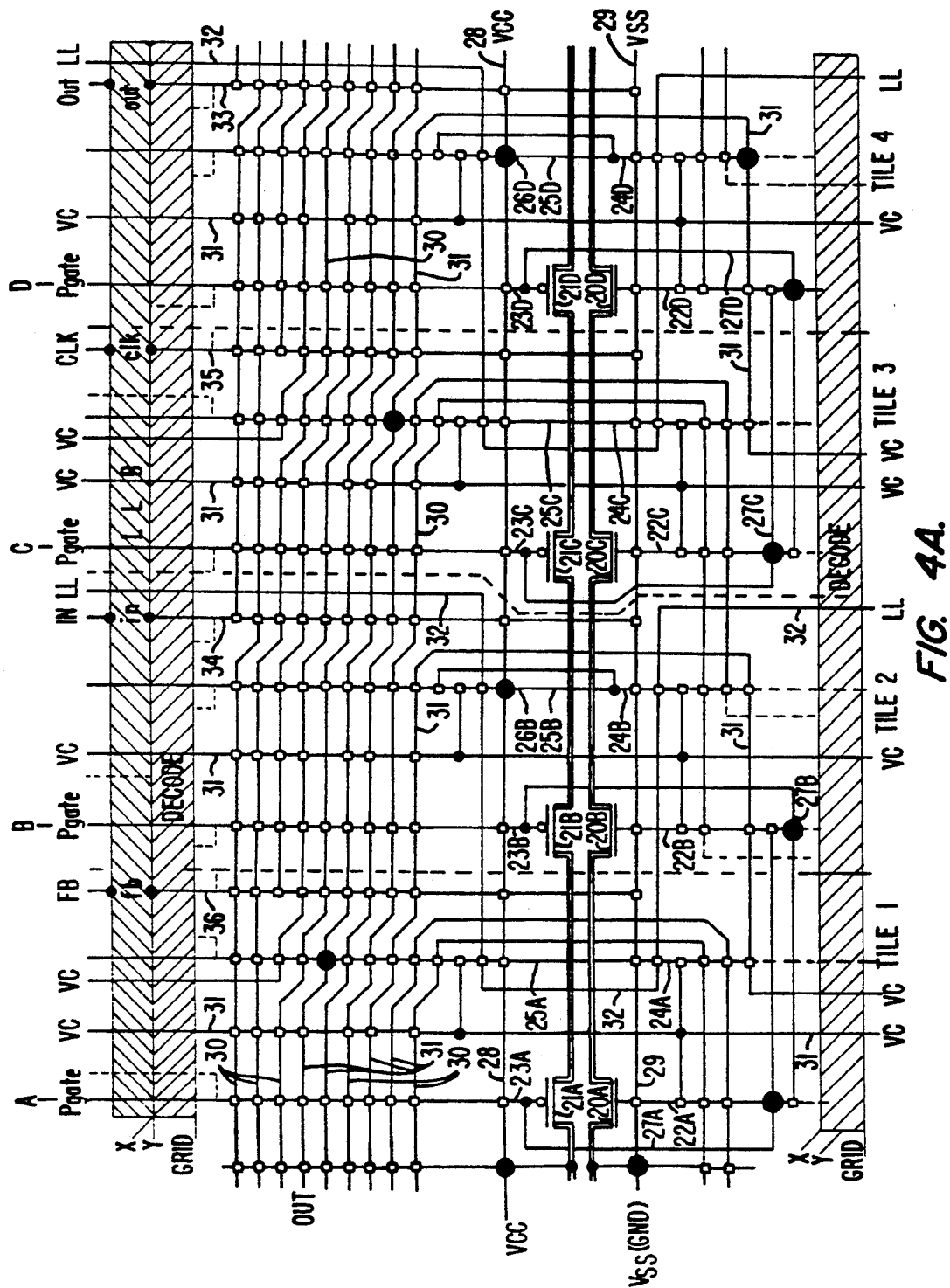
FIGS. 4A and 4B illustrate how a four-input NAND logic gate may be configured in a CST row.
Figure 4B:
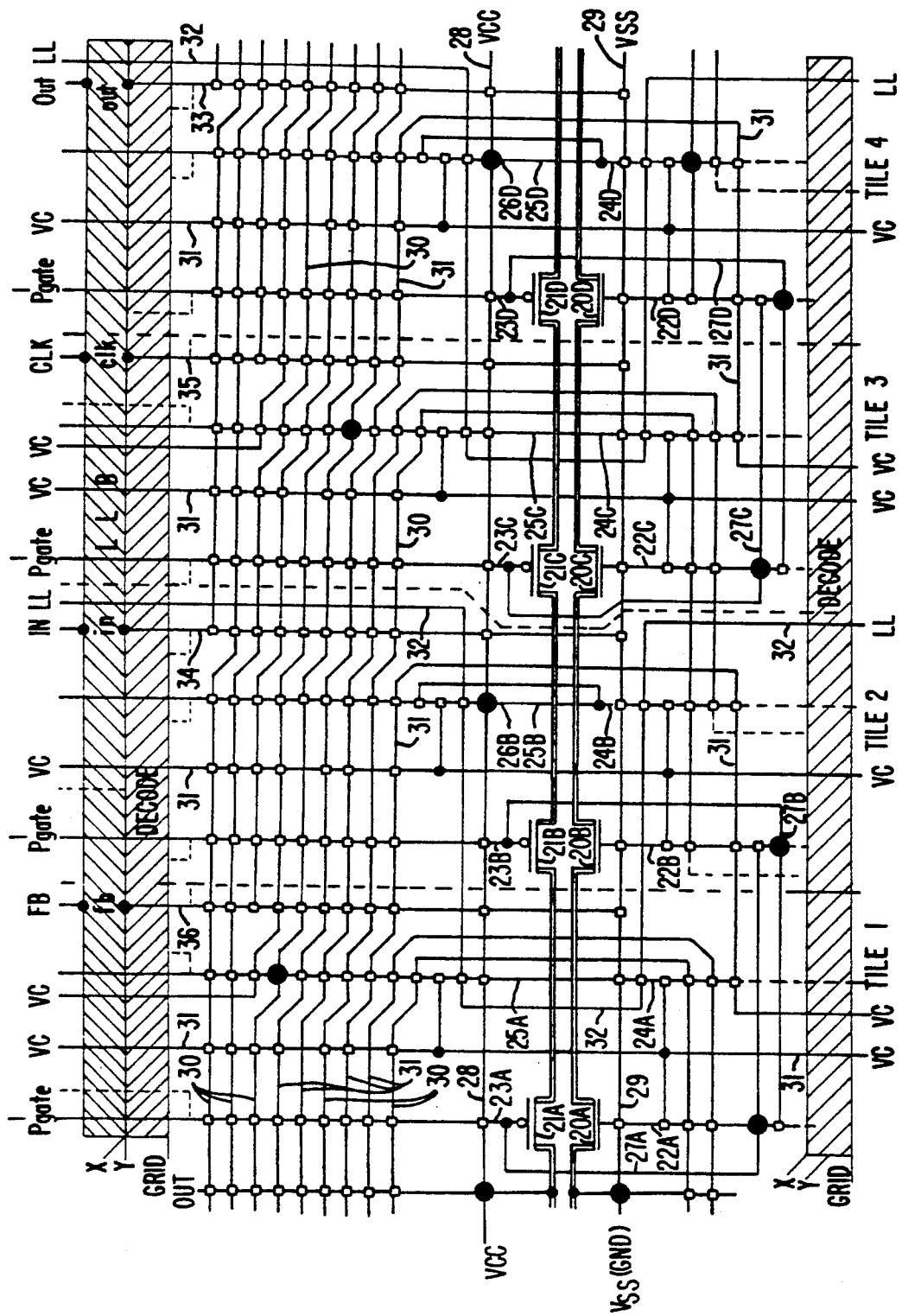

This arrangement of wiring segments and CST transistors can be efficiently configured into logic gates. For example, a NAND gate may be configured with a single chevron 30 or 31 by connecting to one or more P SD segments 24A-24D and one of the N SD segments 25A-25D, as illustrated in FIGS. 4A and 4B which contains some of the same reference numerals as in FIG. 3 for explanatory purposes.

Figure 4C:
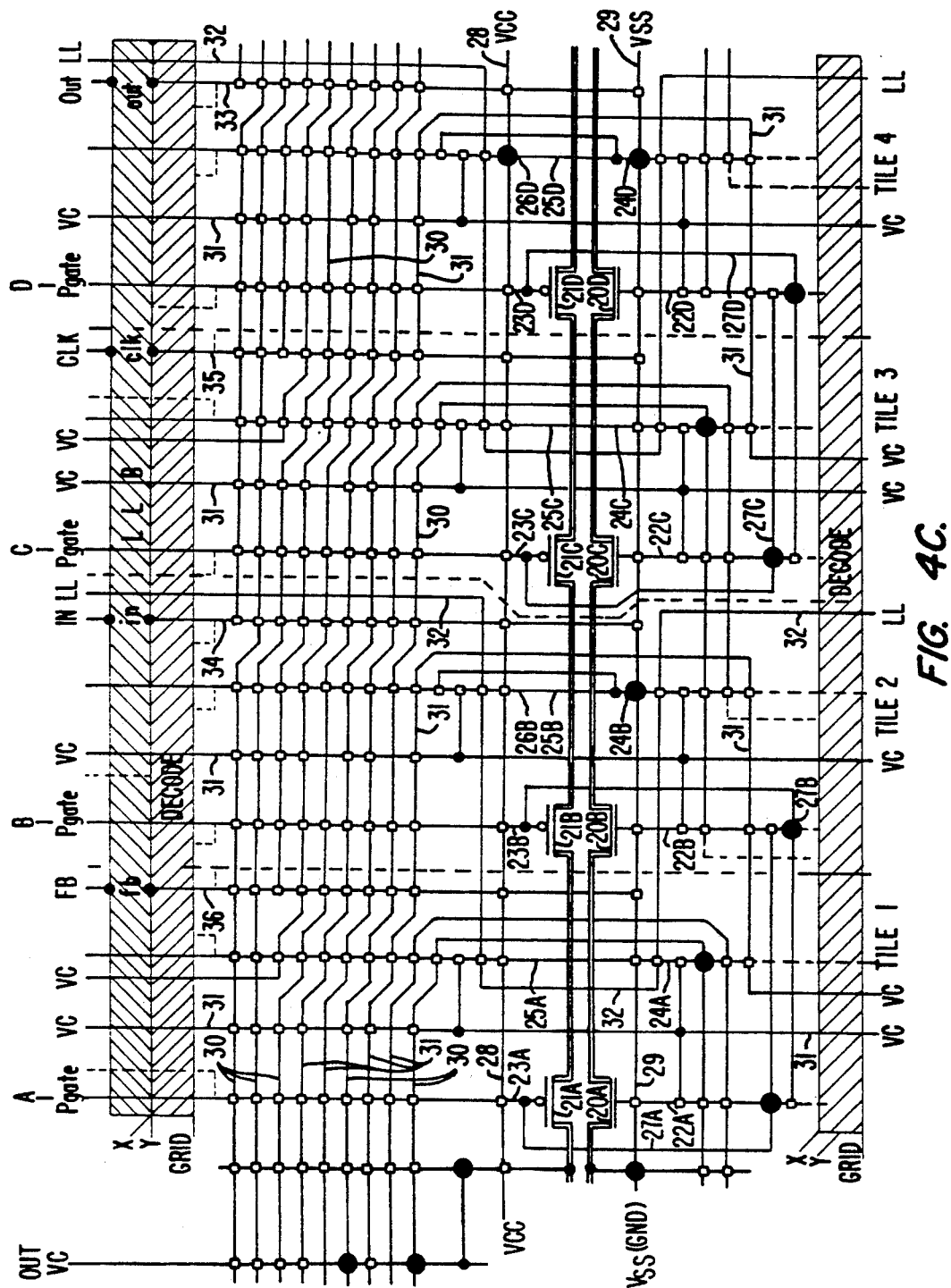
FIGS. 4C and 4D illustrate how a four-input NOR logic gate may be configured in a CST row.
Figure 4D:
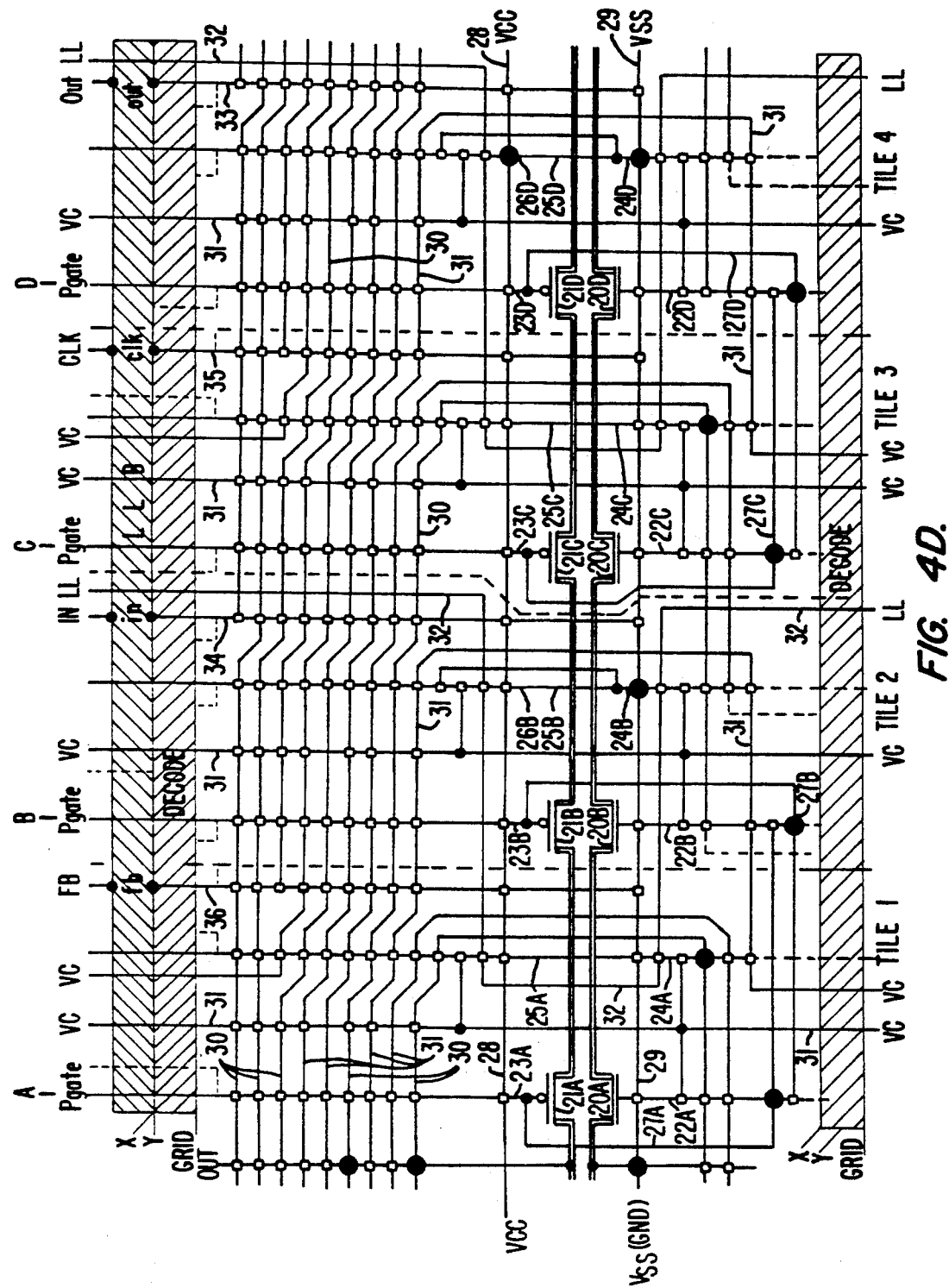

As similarly illustrated in FIGS. 4C and 4D, a NOR gate is configured by one or more local chevrons 30, each fused to an SD segment 25A-25D and to the vertical portion of a vertical chevron 31 or to one of the P SD segments 24A-24D. In either case, direct connections are made to the series transistor portion of a gate. Moreover, the placement of a NAND or NOR logic block (whether routed inside the row or outside) can be horizontally located on any particular transistor along a CST row 15, since all chevrons 30 and 31 hook back to intersect the wiring segments (two N SD segments and one gate segment) of two of the NMOS transistors 21A-21D.

Logic cells configured in a CST row 15 may be isolated from each other by connecting intervening transistors in the row by appropriate connections to the power supply lines at $V_{cc}$ and $V_{ss}$. For a PMOS transistor, the gate electrode is connected to $V_{cc}$. The PMOS transistor is effectively kept from being turned on; no current passes through the source/drains of the transistors. The PMOS transistors forming the logic cells on either side of the isolating transistor are electrically isolated from the other. Likewise, the gate electrode of a NMOS transistor in a CST row 15 is connected to $V_{ss}$ to keep the transistor from being turned on. The transistor becomes an effective isolation between NMOS transistors forming configured logic cells on either side.

The LLB Row

The latch/logic blocks 40 of the rows 16 can implement multiplexer-intensive cells, such as latches, flip-flops, EXCLUSIVE-NOR (XNOR) logic gates, adders, and multiplexers, more efficiently than a configured circuit in the CST rows 15. On the other hand, these LLBs 40 can also be configured to simple logic gates, such as NAND or NOR logic circuits; however, they are inefficient compared to such configured logic cells in the CST rows 15. Additionally the LLB rows 16 can be assembled into moderately sized static RAM blocks without using any CST row 15.

Figure 5A:
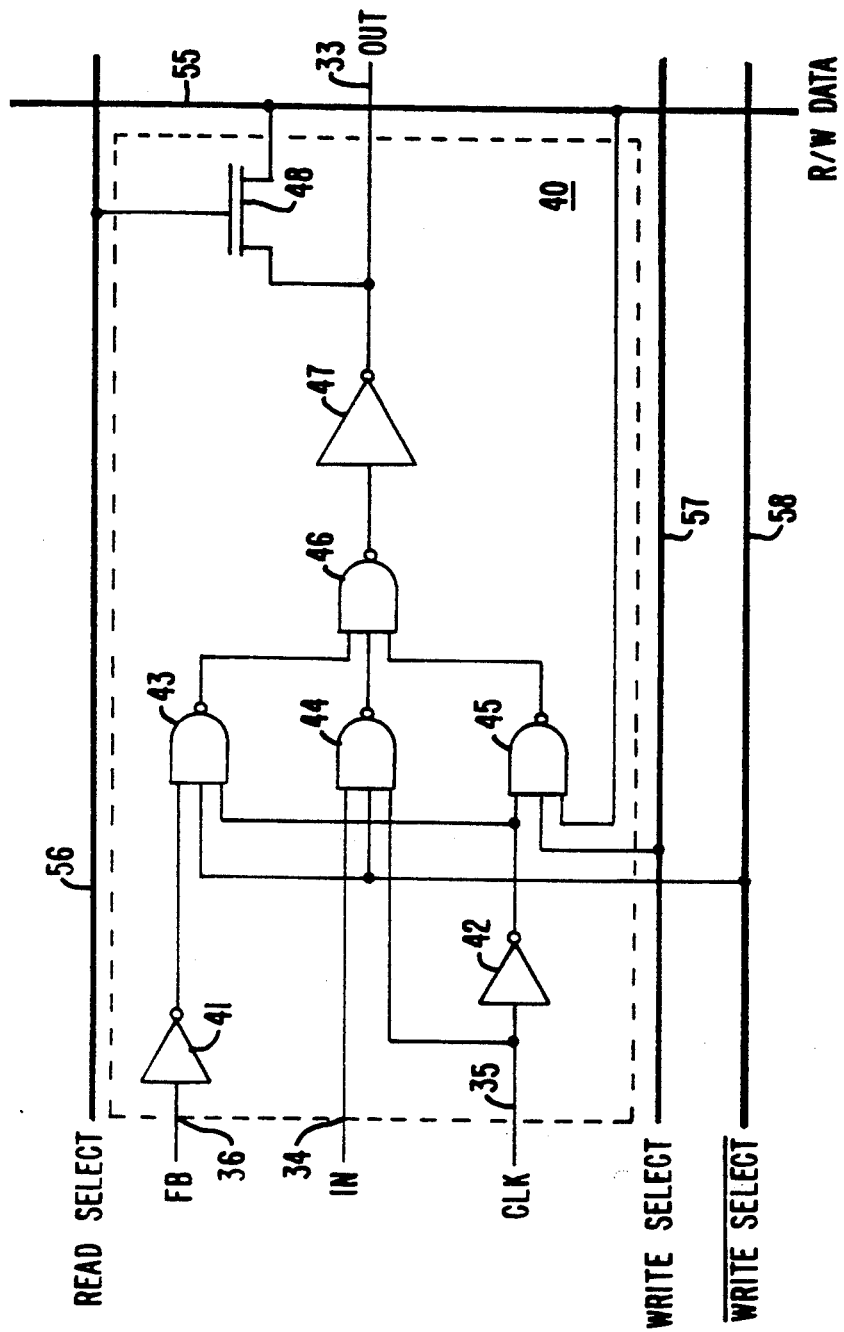
FIG. 5A is a logic circuit schematic of a latch/logic block (LLB)
Figure 5B:
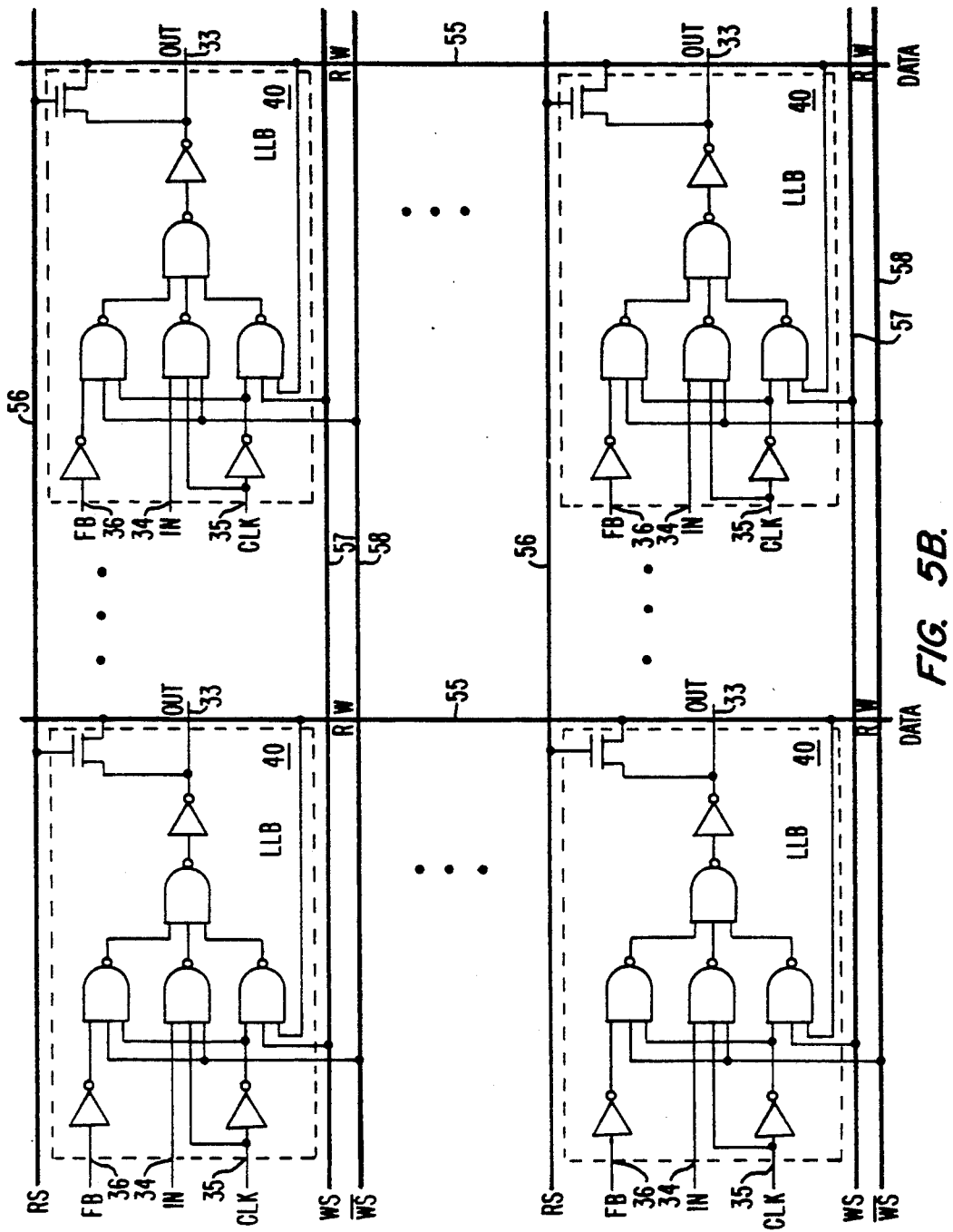
FIG. 5B is a representation of how the LLBs form an array within the core array of FIG. 2.

FIG. 5A is a logic circuit schematic of each latch-/logic block (LLB) 40 in an LLB row 16. The LLB 40 shown within the dotted line box is connected to various wiring segments. The LLB 40 is connected to the OUT, IN, CLK, and FB latch segments 33-36 from the CST row 15 directly below and to a Read Select line 56, Write Select line 57, a complementary Write Select Bar line 58, and a Read/Write (Data) line 55. Associated only with the LLBs 40 and the rows 16, these lines 55-58 organize the LLBs 40 into an array which can be considered separately from the general core array 11. A representation of the LLB 40 array is illustrated in FIG. 5B.

Depending upon how the LLBs 40 are configured by the connection of their latch segments 33-36 and by controlling the as various logic cells, which are described above, or as static RAM cells, in which case the lines 55-58 interconnect the RAM cell array for high-speed operation.

As shown in FIG. 5A, each LLB 40 has an inverter 41 which has an input terminal connected to the FB latch segment 36. Another inverter 42 has its input terminal connected to the CLK latch segment 35. The output terminals of both inverters 41 and 42 are connected to a three-input NAND logic gate 43, which has its third input terminal connected to the Write Select Bar line 58. Also having an input terminal connected to the output terminal of the inverter 42 is a three-input NAND logic gate 45, which has its two remaining input terminals connected to the Write Select line 57 and to the R/W Data line 55. A third three-input NAND logic gate 44 has one input terminal connected to the IN latch segment 34, a second input terminal to the Write Select Bar line 58 and a third input terminal to the CLK latch segment 35.

The output terminals of the three NAND logic gates 43-45 are connected to the input terminals of a fourth three-input NAND logic gate 46 which has its output terminal connected to an inverter 47. The output terminal of the inverter 47 is, in turn, connected to the OUT latch segment 33. The output terminal of the inverter 47 is also connected to a source/drain of a NMOS transistor 48, which has its gate electrode connected to the Read Select line 56 and its other source/drain connected to the Read/Write line 55. The NMOS transistor 48 is used as a pass transistor when the LLB 40 is configured as a RAM cell, as discussed below.

Each LLB 40 is four columns wide and has input and output terminals connected to the vertical latch segments 33-36, i.e., CLK, IN, FB, and OUT in FIG. 3. For clocking the LLB 40 at high speed and minimal skew, the CLK segments of the LLBs 40 can be directly connected, i.e., by programming only one antifuse, to the clock lines in the channels 17. Where low-skew, high-performance timing signals are required in a configured cell in a CST row 15, the clock lines can also be directly connected to any P gate segment from the CST row 15. The channel clock lines may also be indirectly connected to any segment in the array.

The Read Select line 56, Write Select line 57, and the Write Select Bar line 58 run horizontally through each LLB row 16 and are connected to each LLB 40 in the row 16. At the ends of each row 16 there exit channel segments in the adjacent channel 17 which each connect to a buffer that drives selectively, READ Select line 56, Write Select line 57 and Write Select Bar line 58. These segments may be connected to other segments which are always at a constant voltage level of $V_{cc}$ or ground, i.e., logic levels "1" or "0", or they may be connected to segments which are driven by another LLB or CST cell, configured specifically to control the operation of the row 16 of LLBs.

Each LLB block 40 is also connected to a Read/-Write line 55 which runs vertically through every four columns of the core array 11. Each line 55 passes through the CST rows 15 without being connected or connectable. The line 55 is connected, however, to each LLB 40 in its four columns of the array 11.

The LLB 40 is configured by connecting the wiring segments to which the already-configured LLB 40 is connected. Examples of different combinations of connections for the latch segments 33-36 illustrate the different logic blocks possible. To configure a row 16 of LLBs into either logic or latch functions, the segments which selectively control the Read Select line 56 and Write Select line 57 of the row 16 is connected to segments which are at a constant zero voltage level, ground or logic "0", and the segment which controls the Write Select Bar line 58 of the row 16 is connected to a segment with a constant $V_{cc}$ voltage level, logic "1".

Figure 6A:
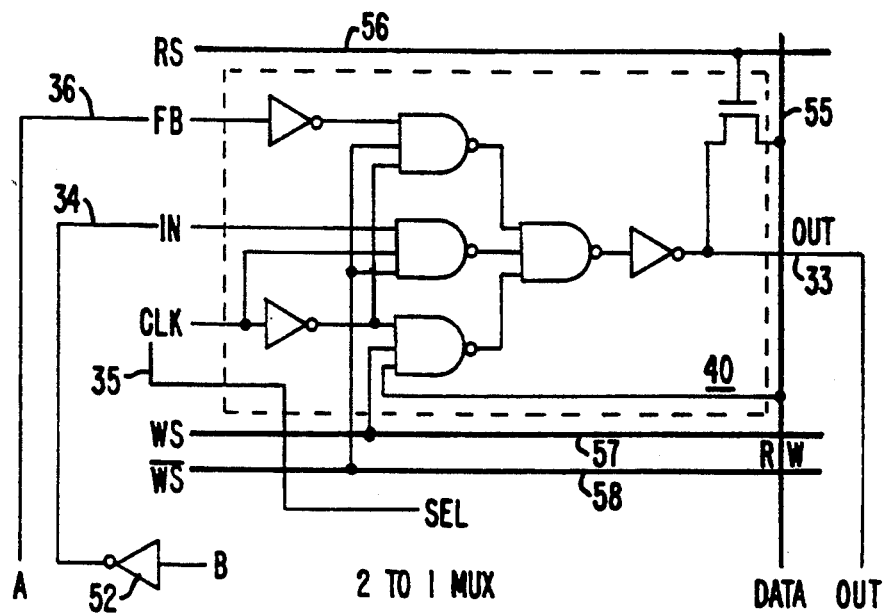
FIG. 6A illustrates how a LLB may be configured as a 2-to-1 multiplexer.

FIG. 6A shows how the LLB 40 can be configured into a 2-to-1-multiplexer with a small part of a CST row 15. The FB segment 36 is used as one input terminal A to the multiplexer. The second input terminal B is formed by connecting the IN segment 34 to a wiring segment which is the output terminal of an inverter 52 which is configured in the CST row 15 below. The input terminal to the inverter 52 is the input terminal B of the multiplexer. The CLK segment 35 of the LLB 40 becomes the control input terminal for selecting between the two input terminals. The OUT segment 33 is the output terminal of the multiplexer block.

Figure 6B:
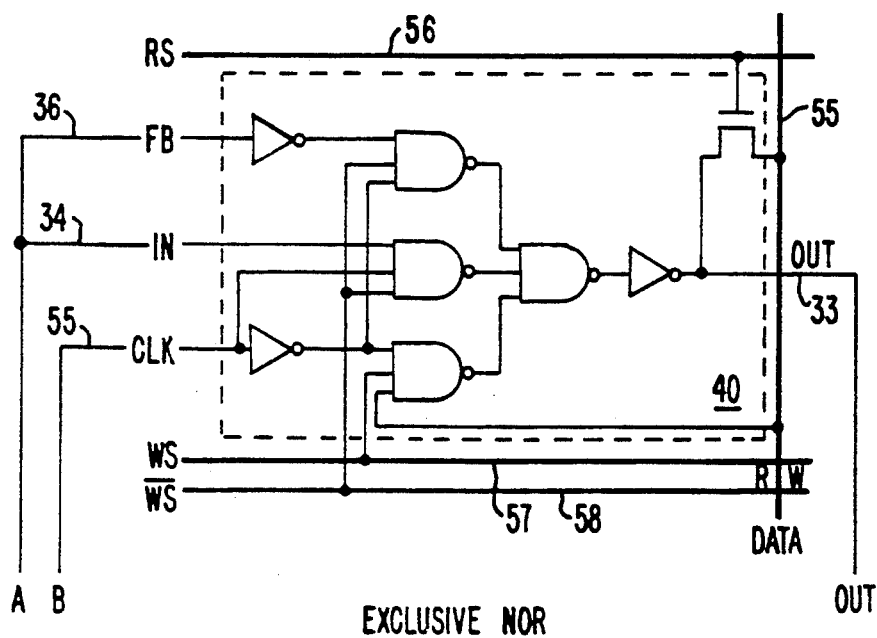
FIG. 6B illustrates how a LLB may be configured as an EXCLUSIVE-NOR logic gate.

Each LLB 40 can easily be configured into an EX-CLUSIVE-NOR logic gate by simply connecting the IN segment 34 to FB segment 36, as shown in FIG. 6B. The common node forms one input terminal A and the CLK segment 35 forms the second input terminal B. The OUT segment 33 forms the output terminal of the XOR logic gate.

Figure 6C:
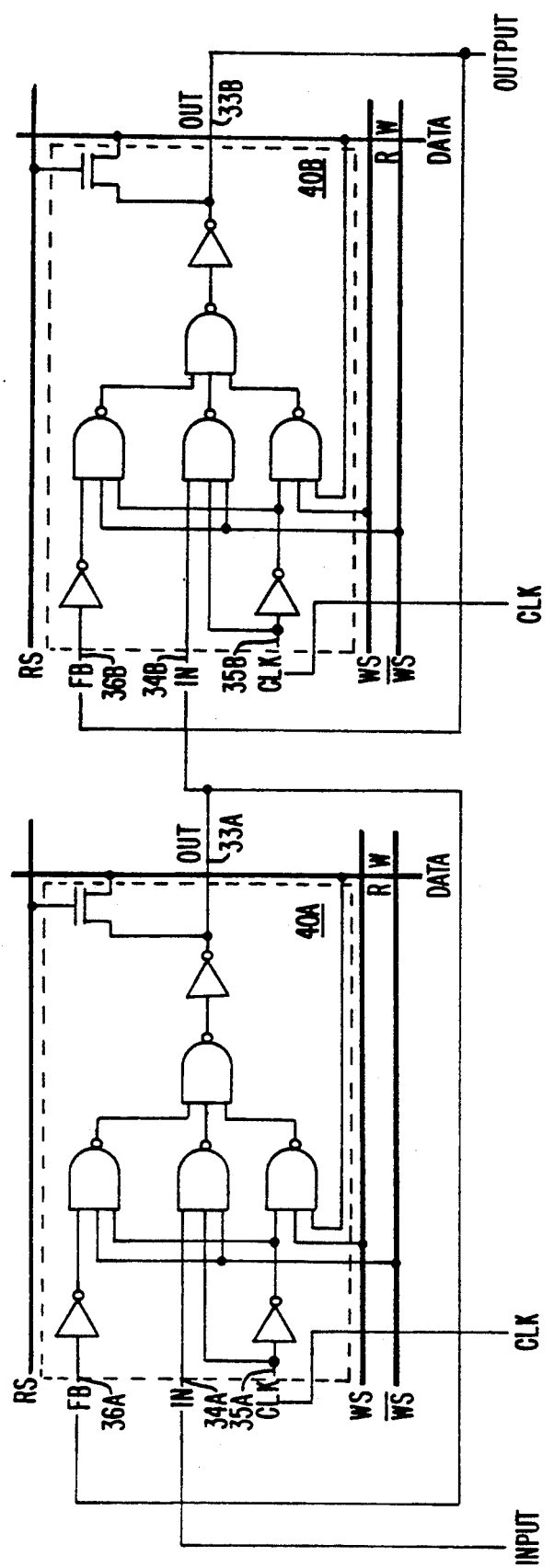
FIG. 6C illustrates two LLBs may be configured as a D flip-flop.

Two neighboring LLBs 40 can be configured into a D flip-flop. As shown in FIG. 6C, the IN segment 34A of a first LLB 40A is the input terminal of the flip-flop. The CLK segment 35A receives a clock signal from the clock lines in the neighboring channel 17. The FB segment 36A is connected to the OUT segment 33A of the first LLB 40A. The OUT segment 33A is also connected to the IN segment 34B of a second LLB 40B, which is timed by the inverse of the clock signal to LLB 40A. LLB 40B receives the inverse clock signal from the clock lines in the channel 17 on its CLK segment 35B. The FB segment 36B of the LLB 40B is connected to the OUT segment of 33B and the common node of the two segments form the output terminal of the D flip-flop.

Figure 6D:
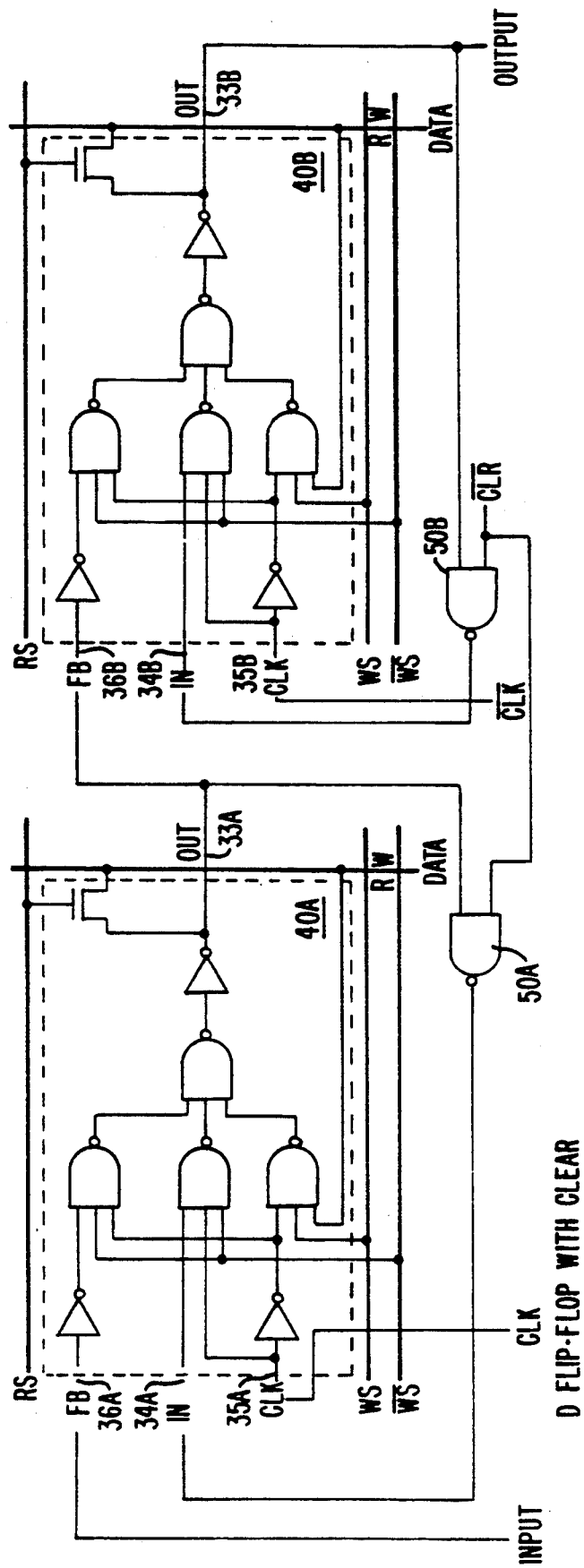
FIG. 6D illustrates how two LLBs may be configured as a D flip-flop with Clear control signals.

FIG. 6D illustrates how to configure two LLBs 40 and some configured logic gates in the neighboring CST row 15 into a D flip-flop with Clear. As in the FIG. 6C circuit, the first LLB 40A receives a clock signal through its CLK segment 35A and the second LLB 40B receives the inverse clock signal through its CLK segment 35B. However, the input terminal to the flip-flop is formed by the FB segment 36A of the LLB 40A. The IN segment 34A of the LLB 40A is connected to its OUT segment 33A through a configured NAND gate cell 50A in the CST row 15 below, i.e., the output terminal of the NAND gate cell 50A is connected to the IN segment 34A and one input terminal of the cell 50A is connected to the OUT segment 33A. The other input terminal of the cell 50A receives the inverse of the Clear control signal for the configured D flip-flop.

The OUT segment 33A is also connected to the FB segment 36B of the second LLB 40B, which also has its IN segment 34B connected to its OUT segment 33B through a second configured NAND gate cell 50B in the CST row 15 below. The output terminal of the NAND gate cell 50B is connected to the IN segment 34B. One input terminal of the cell 50B is connected to the OUT segment 33B and the common node forms the output terminal of the D flip-flop. The other input terminal of the cell 50B, as does the second input terminal of the cell 50A, receives the inverse of the Clear control signal for the configured D flip-flop.

Two LLBs 40 and some configured logic cells in a CST row 15 can also form a D flip-flip with Set and Clear. As illustrated in FIG. 6E, the neighboring LLBs 40A and 40B are connected in nearly the same way as in FIG. 6D. In this case, however, the logic cells configured in the CST row 15 are not NAND logic cells, but rather NOR-NAND logic gate combination cells 51A and 51B. Each combination 51A and 51B has a NOR gate having its output terminal connected to its respective IN segment 34A and 34B. In each combination 51A and 51B one input terminal of the NOR gate receives the Set control signal. The other input terminal of the NOR logic gate is connected to the output terminal of an AND logic gate, which has one input terminal connected to its respective OUT segment 33A and 33B. The other input terminal of the AND gate receives the inverse of the Clear control signal. Thus both configured logic gate combinations 51A and 51B receive Set and the inverse of the Clear control signals.

Each LLB 40 can also be configured as a static RAM cell. Here the Read Select line 56, the Write Select line 57, the Write Select Bar 58 and the Read/Write line 58 are used. Their respective channel segments which control the lines 56–58 are connected to segments which are driven by CST row logic configured specifically for controlling the RAM function of the LLBs.

Figure 7A:
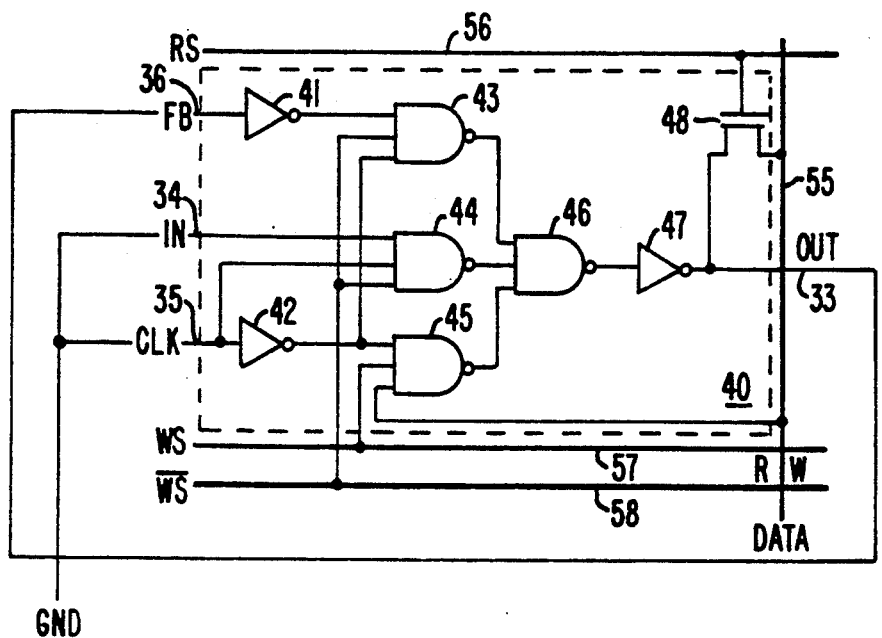
FIG. 7A illustrates the configuration of a LLB as a single-port static RAM cell.

A LLB 40 configured as a single-port static RAM cell is illustrated in FIG. 7A. The IN latch segment 34 and the CLK latch segment 35 are connected to a power supply line at ground and the FB segment 36 is connected to the OUT segment 33. In operation, the configured RAM cell is read by a control signal on the Read Select line 56 to turn on the transistor 48. The data signal, i.e., the logic state which had been stored in the cell by the feedback action of the Out latch segment 33 to the FB (FeedBack) segment 36, then appears on the Read/Write line 55. To write to the RAM cell, the data signal to be stored is placed on the Read/Write line 55. When the Read Select line 57 is high, the data signal enters the cell through the NAND logic gate 45 and is latched in the cell when the Read Select line 57 returns to low (and the Read Select Bar line 58 goes high).

Figure 7B:
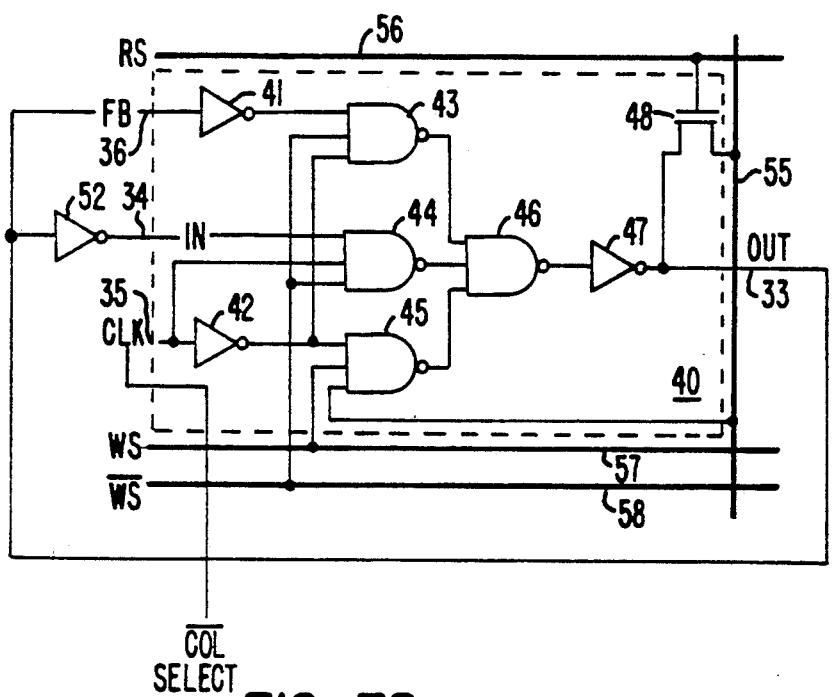
FIG. 7B illustrates how a LLB may be configured as a single-port, folded static RAM cell.

FIG. 7B illustrates the LLB 40 configured as a single-port static RAM cell with Column Select. The OUT segment 33 is connected to the FB segment 36 and to the IN segment 34 through an inverter 52 which is configured in the CST row 15 below. The CLK latch segment 35 is connected to a line which is configured to carry a Column Select Bar control signal. The Column Select Bar control signal, when low, enables the operation of the memory cell. As in the case of the cell illustrated in FIG. 7A, the data signal to be written into, and read out of, the configured static RAM is carried on the Read/Write (RW) line 55. Control signals for the reading and writing operations are respectively carried on the Read Select line 56, and on the Write Select and Write Select Bar lines 57 and 58.

Figure 7C:
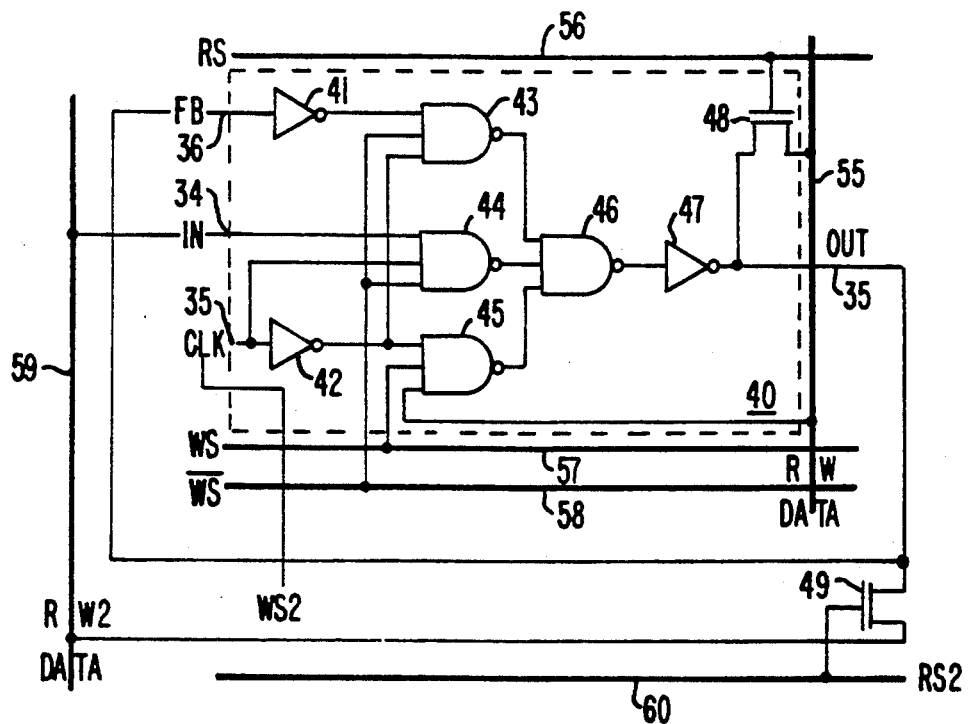
FIG. 7C illustrates how a LLB may be configured as a two-port static RAM cell.

Each LLB 40 may also be configured as a two-port static RAM cell, as shown in FIG. 7C. In this configuration one transistor from the CST row 15 below and various wiring segments are used. The configured LLB 40 has its OUT segment 33 connected to the FB segment 36 for the data latching function. The first port is the same as in the single-port static RAM configurations above. The Read/Write line 55 carries data signals in and out of the cell with the Read Select line 56 controlling a read operation through the first port. The Write Select and Write Select Bar lines 57 and 58 control the Write operations through the first port (and also the second port).

The second port includes a pass transistor 49 from the CST row 15 below. The transistor 49 has one source/drain connected to the OUT latch segment 33 and FB segment 36. The other source/drain is connected to a wiring segment which is connected to other wiring segments to form a second Read/Write line 59, which is also connected to the IN latch segment 34. The gate of the transistor 49 is connected to a wiring segment which is connected to other wiring segments to form a second Read Select line 60. Thus responsive to a Read control signal on the gate of the transistor 49 from the second Read Select line 60, the data signal stored in the cell is transferred to the second Read/Write line 59. During a second port Write operation, data signals are passed through the second Read/Write line 59 and onto the IN segment 34.

Figure 8:
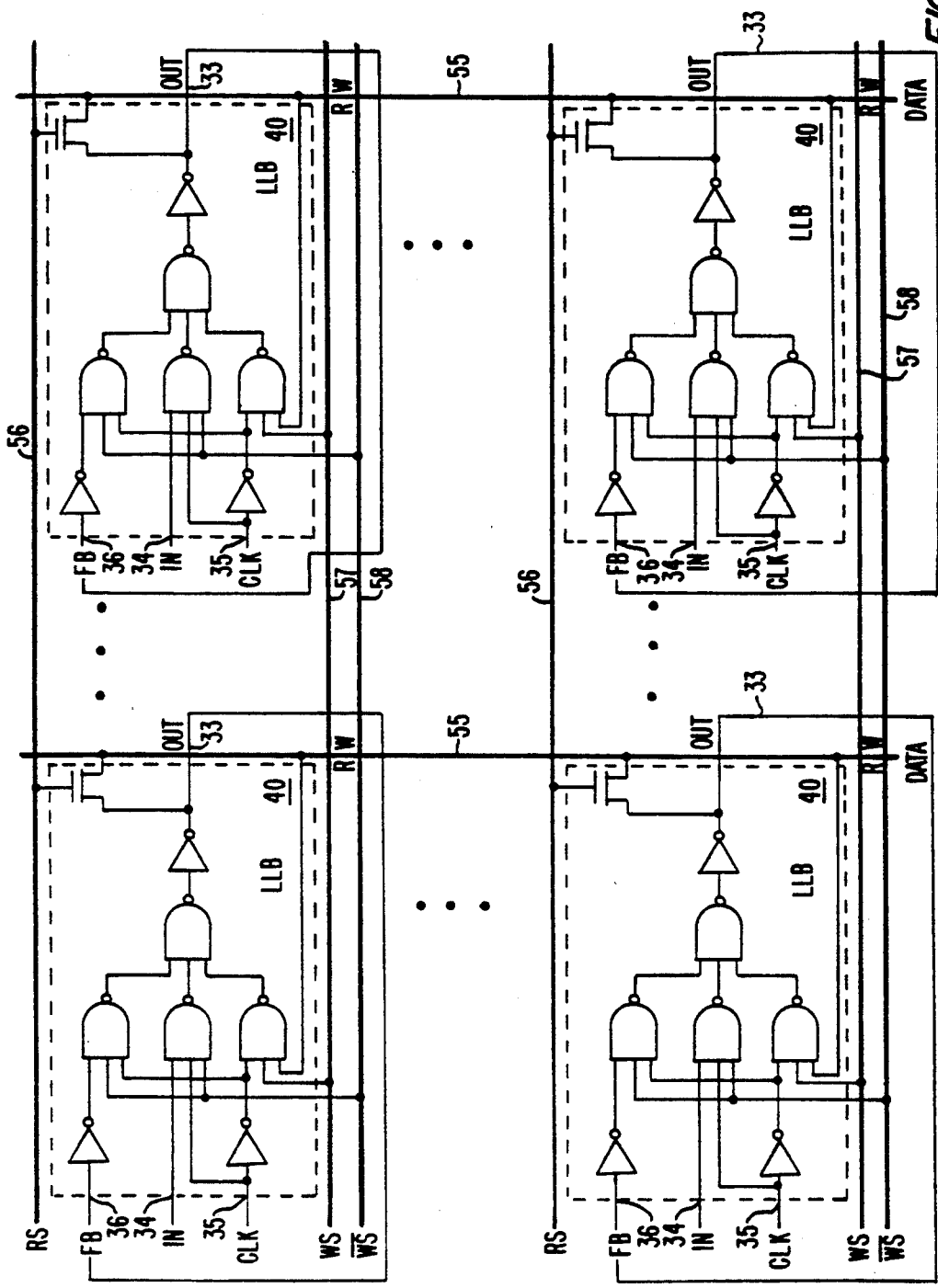
FIG. 8 shows how the LLBs configured as static RAM cells may be arranged as an memory array.

FIG. 8 illustrates one example of a static RAM array in the core array 11. The LLBs 40 are configured as single-port static RAM cells in the rows 16. The Read/Write lines 55 of the array are the bit lines of the RAM array and carry the data signals to and from the memory cells for Write and Read operations. Operating as word lines, the Read Select lines 56 carry the Read operation control signals, and the Write Select and Write Select Bar lines 57 and 58 carry the Write operation control signals. As in any RAM array, a memory cell is selected by the selection of a column of memory cells, i.e., bit line selection, and a row of memory cells, i.e., word line selection.

Figure 9:
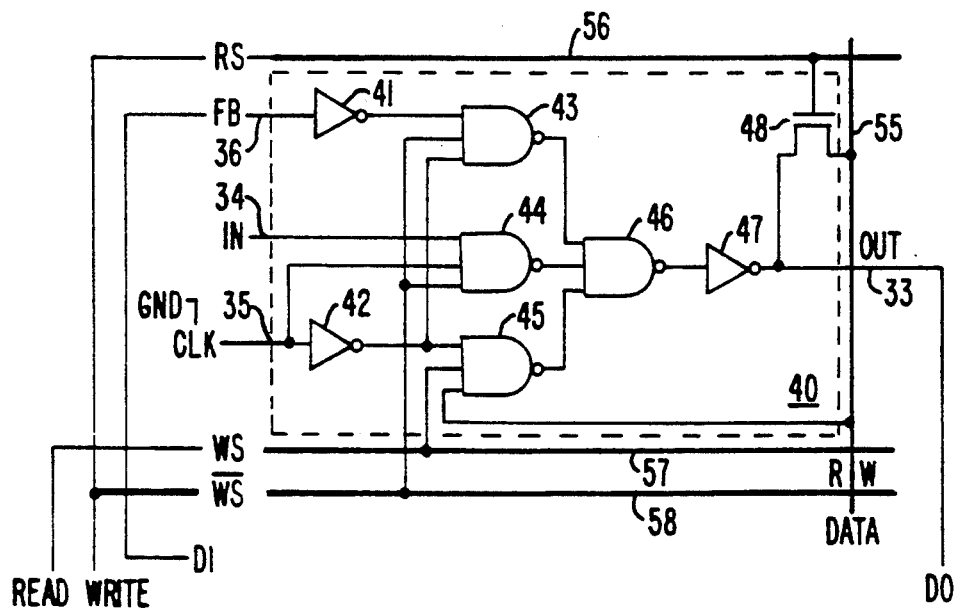
FIG. 9 illustrates the configuration of a LLB as a RAM cell input buffer and output sense amplifier for the memory array of FIG. 8.

For RAM array operation, some of the LLBs 40 in the rows 16 may be used as input buffers in Write operations and as sense amplifiers in Read operations. The configuration of a LLB 40 as an input buffer/sense amplifier is shown in FIG. 9. The IN latch segment 34 is left alone (the configured logic in the LLB 40 renders the signal on the segment 34 to a DON'T CARE state) and the CLK latch segment 35 is tied to ground. The FB segment 36 becomes the input terminal for input data signals when LLB 40 operates as an input buffer and the segment 36 is connected as such. The OUT segment 33 becomes the output terminal for output data signals when the LLB 40 operates as a sense amplifier and the segment 33 is connected as such. The Read Select line 56 and the Write Select Bar line 58 are tied together and connected so as to carry the Write control signal for input buffer operations. The Write Select line 57 is connected so as to carry the Read Select signal for sense amplifier operations.

During a input buffer, or Write, operation, the configured LLB 40 receives a data signal to be written into the RAM array on FB segment 36. A Write control signal appears on the Read Select line 56 and on the Write Select Bar line 58. With the transistor 48 turned on, the data signal on the FB latch segment 36 is written onto the Read/Write line 55, which is the bit line for a column of configured static RAM cells of which one is selected for a Write operation. The data signal is written into the selected RAM cell.

During a sense amplifier, or Read, operation, a data signal is placed on the Read/Write line 55 by the selected static RAM cell in the column of cells connected to the line 55. A Read control signal appears on the Write Select line 57 and the data signal on the Read/Write line 55 enters the NAND logic gate 45. The inverted data signal appears on the OUT latch segment 33. The data signal is read out from the selected RAM cell.

Thus the LLBs are connected into an array by one vertical and two horizontal signal lines. Each LLB is also locally connected to three input wiring segments and one output wiring segment, which are programmable to make various connections, including feedback connections so that, instead of only logic operations, the LLB latches data signals to function as a memory cell.

Figure 5C:
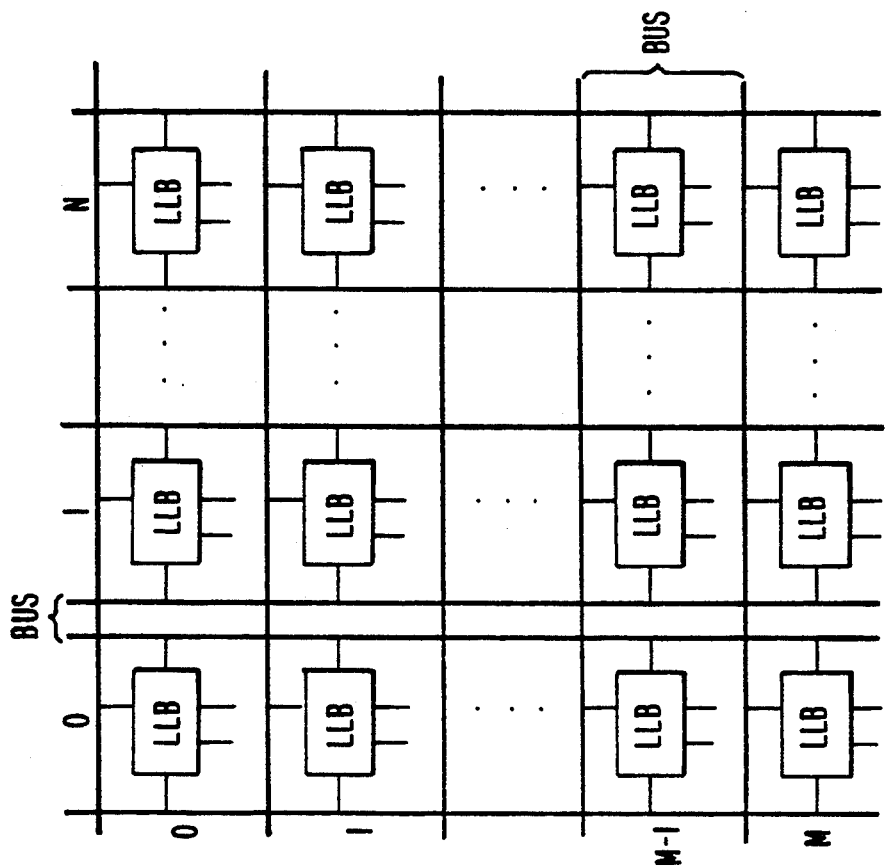
FIG. 5C is a generalized LLB array.
Figure 5D:
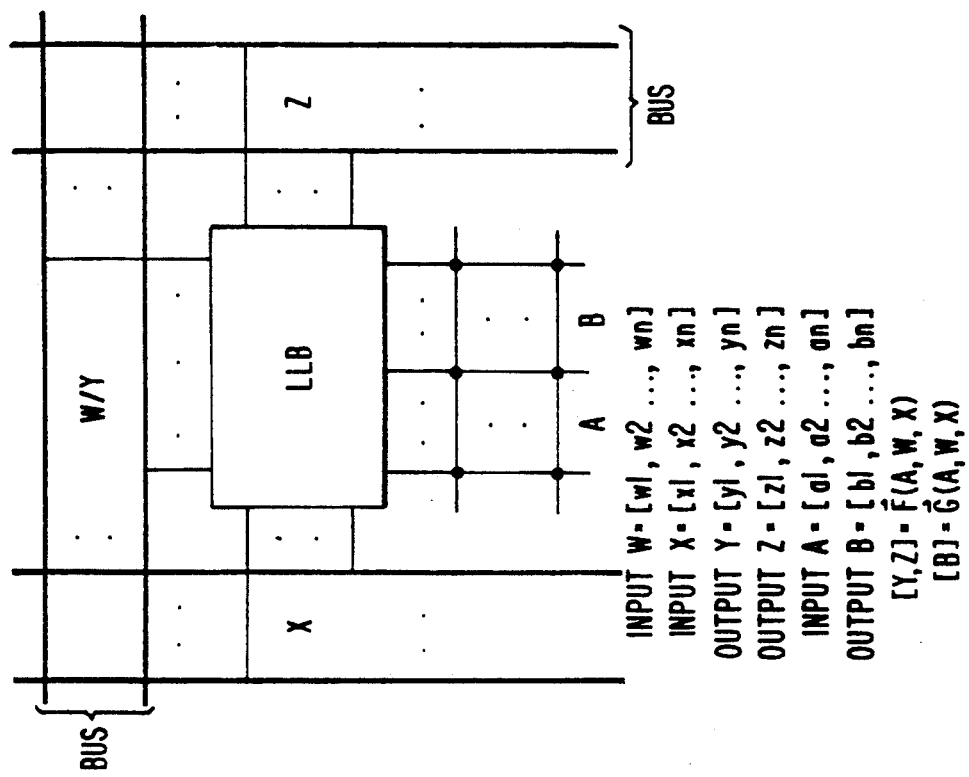
FIG. 5D illustrates routing details of LLB Inputs and Outputs.

This array of LLBs can be generalized into LLB arrays as shown in FIG. 5C which have a plurality of vertical and horizontal signal lines to which each LLB is connected. Note that in the drawing, each line symbolically represents a bus of parallel lines. As shown in FIG. 5D, each LLB of FIG. 5C is also connected to a plurality of programmable input and output wiring segments. The LLB can be logically designed to programmably generate a plurality of output signals (a vector function), rather than a single signal, responsive to the input signals. Depending upon the configuration of the various lines, these input signals may be on the vertical signal lines and/or the horizontal signal lines and/or the programmable input wiring segments. Likewise, the output signals may be on the vertical signal lines and/or the horizontal signal lines and/or the programmable output wiring segments depending upon the configuration of the various lines.

Furthermore, the LLB itself can be configured by the programming of the connections of the input and output wiring segments so that each of the output signals are logic and/or memory functions.

Of course, in the described embodiment of the present invention a simpler version of the generalized LLB array fits into the core array 11. The array 11 has the CST rows 15 containing transistors which can be individually and flexibly connected into nearly any desired cell and the LLB rows 16 containing pre-configured blocks 40 which can be easily be configured into certain types of logic cells by making connections external to the LLB 40. The LLBs 40 also form an array within the core array 11 so that part, or all, of the LLB 40 array can form a RAM array.

FPGA Programming

To make the desired connections and program the FPGA, the antifuses are used to configure the logic cells and to make cell-to-cell connections inside the FPGA. As described above, the transistors of the CST rows 15 and LLBs 40 in the LLB rows 16 are connected to wiring segments. These wiring segments intersect with antifuses between the wiring segments at the intersections. Thus selected antifuses are programmed to make the desired electrical connections to configure the wiring segments, CST transistors and LLBs into the desired cells and to make the intercell connections.

The Programming Circuits

To connect two intersecting wiring segments, the two wiring segments must be simultaneously and independently addressed. One wiring segment is driven to the programming voltage $V_{pp}$ and the other wiring segment is driven to the programming voltage $V_{ss}$. The difference between the two programming voltages across the antifuse at the intersection of the two segments programs the antifuse.

In general, every wiring segment in the core array 11 is connected to large transistors for programming purposes. In the embodiment described, each wiring segment is connected to a PMOS and a NMOS transistor, though bipolar transistors could be used in, say, a BiCMOS implementation of the FPGA of the present invention. The PMOS programming transistor, connected to a + address circuit, drives the wiring segment to $V_{pp}$ during programming and the NMOS programming transistor, connected to a − address circuit, drives the segment to $V_{ss}$ during programming.

The ability to drive an arbitrary wiring segment to $V_{pp}$ or $V_{ss}$ simplifies the rules and sequence of programming the antifuses of the core array 11 to properly make the many connections required for a user's application. If the wiring segments are constrained to one programming voltage or other, additional complexity is added to the programming rules and sequences. Thus the present invention is based on the more general and desirable programming case.

The +, or $V_{pp}$, address circuit, and the −, or $V_{ss}$, address circuit are two independent circuits for programming. Through the + address circuit and PMOS programming transistor, a + addressed wiring segment is driven to $V_{pp}$ and is connected ultimately to a $V_{pp}$ pin (at +10 volts) of the FPGA integrated circuit during programming; through the − address circuit and NMOS programming transistor, the − addressed wiring segment is driven to $V_{ss}$ and is connected ultimately to the ground pin of the FPGA during programming.

Each of the + and − programming address circuits are separated into two parts. One part of the programming address circuits decodes address signals down to a bank of eight programming transistors connected to the wiring segments in a four-tile group in a CST row 15. Thus these address signals, represented by +X, +Y for the + address circuit and −X, −Y for the − address circuit, select eight PMOS programming transistors (and eight wiring segments) for the $V_{pp}$ programming voltage and eight NMOS programing transistors (eight wiring segments) for the $V_{ss}$ programming voltage. The selection of the particular PMOS programming transistor of the eight selected by the +X, +Y address signals and NMOS programming transistor of the eight selected by the −X, −Y address signals is performed by connecting only one of the eight PMOS programming transistors to $V_{pp}$ and only one of the eight NMOS transistors to $V_{ss}$.

Figure 10:
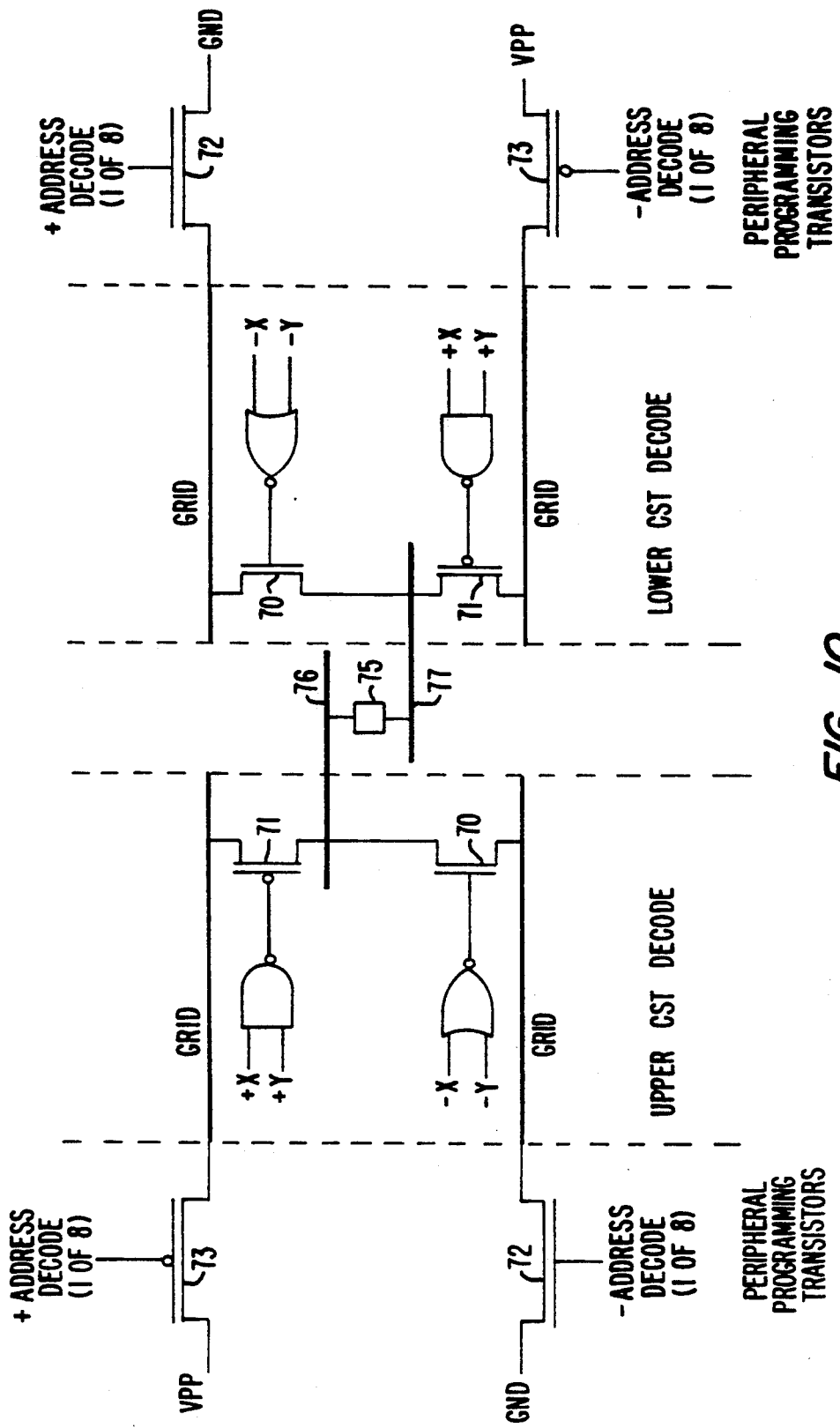
FIG. 10 shows the general arrangement of the programming circuits for each wiring segment in the core array of the FPGA.

As illustrated in an generalized form in FIG. 10, each wiring segment 76 and 77 is connected to a PMOS programming transistor 71 and a NMOS programming transistor 70. The + and − address decoding occurs on both the sources and gates of the programming transistors. For PMOS programming transistors, +X, +Y address signals are decoded for the gates. For NMOS programming transistors, −X, −Y address signals are decoded for the gates. For the + and − address decoding on the sources of the programming transistors, the source node of each PMOS programming transistor 71 is connected to 1 of 8 $V_{pp}$ voltage supplies in the form of eight + programming grids. Likewise, the source node of the NMOS programming transistor 70 is connected to 1 of 8 $V_{ss}$ voltage supplies also in the form of eight − programming grids.

Each programming grid is formed from metal lines which run horizontally in every CST row 15. Each grid is regularly cross-connected vertically. Grids are used, rather than only horizontal lines, to minimize the effective metal resistance between the source node of any programming transistor and the edge of the array 11 where the grids are connected to the $V_{pp}$ and $V_{ss}$ programming voltages. In this manner sufficient power can be delivered to any antifuse in the array 11 to program the antifuse.

The programming grids are not connected directly to the $V_{ss}$ and $V_{ss}$ power pins on the integrated circuit. Between the grids and the pins are many large transistors distributed around the periphery of the array 11. These peripheral programming transistors, represented by transistors 72 and 73 in FIG. 10, are connected such that during the programming of an antifuse, represented by an antifuse 75 in FIG. 10, only one + programming grid is connected to the $V_{pp}$ pin and only one − programming grid is connected to the $V_{ss}$ pin.

The remaining programming grids are at an intermediate voltage $V_{pr}$, +5 volts, which is obtained by a precharge operation prior to the programming of the selected antifuse. In the precharge operation, all of the + and − programming grids are set to +5 volts and all of the programming transistors are turned on and then turned off. Except for the isolation of elements in the CST rows 15 discussed below, all of the wiring segments are then left floating at +5 volts.

As mentioned above, the +X,+Y and −X,−Y signals address the gates of eight programming transistors 70 and 71, one of which is connected to the desired wiring segment. The desired wiring segment is selected by the selection of the grid which is connected to the programming transistor connected to the desired segment.

The +X,+Y address signals are used to connect the wiring segment to the high programming voltage $V_{pp}$, while the −X,−Y address signals are used to connect the wiring segment to the low programming voltage $V_{ss}$. As shown in FIG. 10, the decode logic receiving these address signals is such that an inversion of the address signals switches the polarity of the programming.

Figure 11:
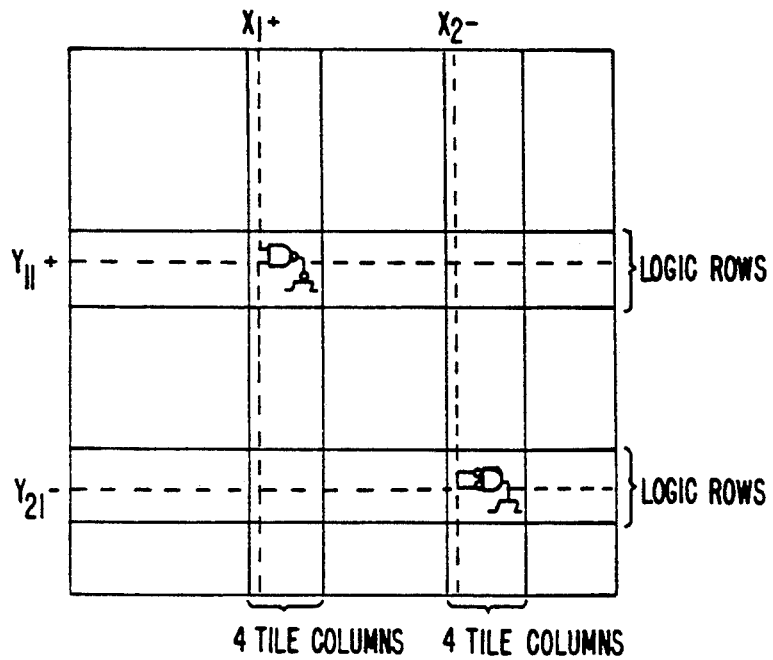
FIG. 11 illustrates the X,Y addressing of wiring segments for programming antifuses.

The +X,+Y and −X,−Y addressing to select a bank of eight PMOS or eight NMOS programming transistors respectively is shown representationally in FIG. 11. The +X,+Y and −X,−Y addressing is used to select a four-tile group of wiring segments and their programming transistors within one CST row 15. This +X,+Y and −X,−Y addressing is such that every four-tile column of the array 11 has one +X programming control line and one −X programming control line and every row 15 has four +Y programming control lines and four −Y programming control lines. The four pairs of +X,+Y1 programming control lines, X,+Y2 programming control lines, +X,+Y3 programming control lines, and +X,+Y4 programming control lines are each NANDed together to produce eight local + programming control signals for row Y and four-tile column X. Each local + programming control signal is sent to the gates of a bank of eight PMOS programming transistors, of which one has a source node connected to a + programming grid which is driven to $V_{pp}$ during programming.

Likewise, the pairs of −X,−Y1 programming control lines, −X,−Y2 programming control lines, −X,−Y3 programming control lines, and −X,−Y4 programming control lines are each NORed together to produce eight local − programming control signals for the row Y and the four-tile column X. Each local − control signals is sent to the gate electrodes of a bank of eight NMOS programming transistors, of which one has a source node connected to a − programming grid which is driven to $V_{ss}$ during programming.

Thus, with four local + programming controls and eight + grids, 32 PMOS programming transistors (and their connected wiring segments) can be uniquely addressed per four-tile group. Similarly, with four local − programming controls and eight − grids, 32 NMOS programming transistors (and their tile group. FIG. 12A tabulates these wiring segments in a four-tile group.

For each + and − address programming, there are four logic gates each having eight programming control lines as output, eight programming grids, and 32 programming transistors, either NMOS or PMOS. FIGS. 12B and 12C list + and − address decoding for a four-tile group in a tabular format according to their local programming control line (top of table) and grid line (left of table). The decoding logic gates and programming transistors are broken into an Upper Decode Logic block 80 and a Lower Decode Logic block 81 in the four-tile group. This structure repeats every four tiles across each CST row 15 in the array 11.

The Upper Decode Logic block 80 handles the programming voltages of the wiring segments in the upper portion of the four-tile group. The wiring segments include latch segments to the LLB 40 above and some of the horizontal wiring tracks in the channel 17 above. The Lower Decode Logic block 81 handles the programming voltages for the wiring segments in the lower half of the four-tile group. The wiring segments also include horizontal wiring tracks in the channel 17 below the CST row 15.

FIG. 3 illustrates how the programming grids and decode logic may be arranged in each CST row 15. The Upper and Lower Decode Logic blocks 80 and 81 contain the programming transistors, represented by the transistors 70 and 71 of FIG. 10, and the wiring from the blocks 80 and 81 are the connections from the programming transistors 70 and 71 to the wiring segments of the tiles in a CST row 15. The Decode Logic Blocks 80 also contain the eight horizontal +Y1 to +Y4 and −Y1 to −Y4 programming control lines. The vertical +X and −X address lines are not shown. The horizontal + and − programming grids are represented by the Grid Blocks 82.

FIG. 3 also illustrates the point that the programming functions are spread between the core array 11 and the periphery of the FPGA to minimize the space occupied by the programming address circuits. At the periphery of the integrated circuit, the peripheral programming transistors decode the addresses for the selected + and − programming grids. The remainder of the decoding is performed by the Decode Logic Blocks 80 and 81 in the CST rows 15. Of course, the programming address circuits may be organized differently depending upon different constraints of the particular FPGA being designed.

CST Row Isolation Circuits

Besides the programming circuits discussed above, the gates of the transistors in the CST rows 15 are connected to CST row isolation circuits. These circuits are used to ensure the turn off of PMOS and NMOS transistors in the CST rows 15 to prevent spurious current paths during programming of the antifuses. Ideally, besides the intermediate voltage precharge operation described previously, the gate electrodes of the PMOS and NMOS transistors in the CST rows 15 could be precharged to a high voltage in one direction or another, i.e., $V_{pp}$ and $V_{ss}$, during programming to ensure turn off of the transistors. However, process deficiencies leading to leakage currents may render ideal operation problematical. The isolation circuits described below ensure isolation by the selected transistor(s) in the CST rows 15 during programming.

Figure 13:
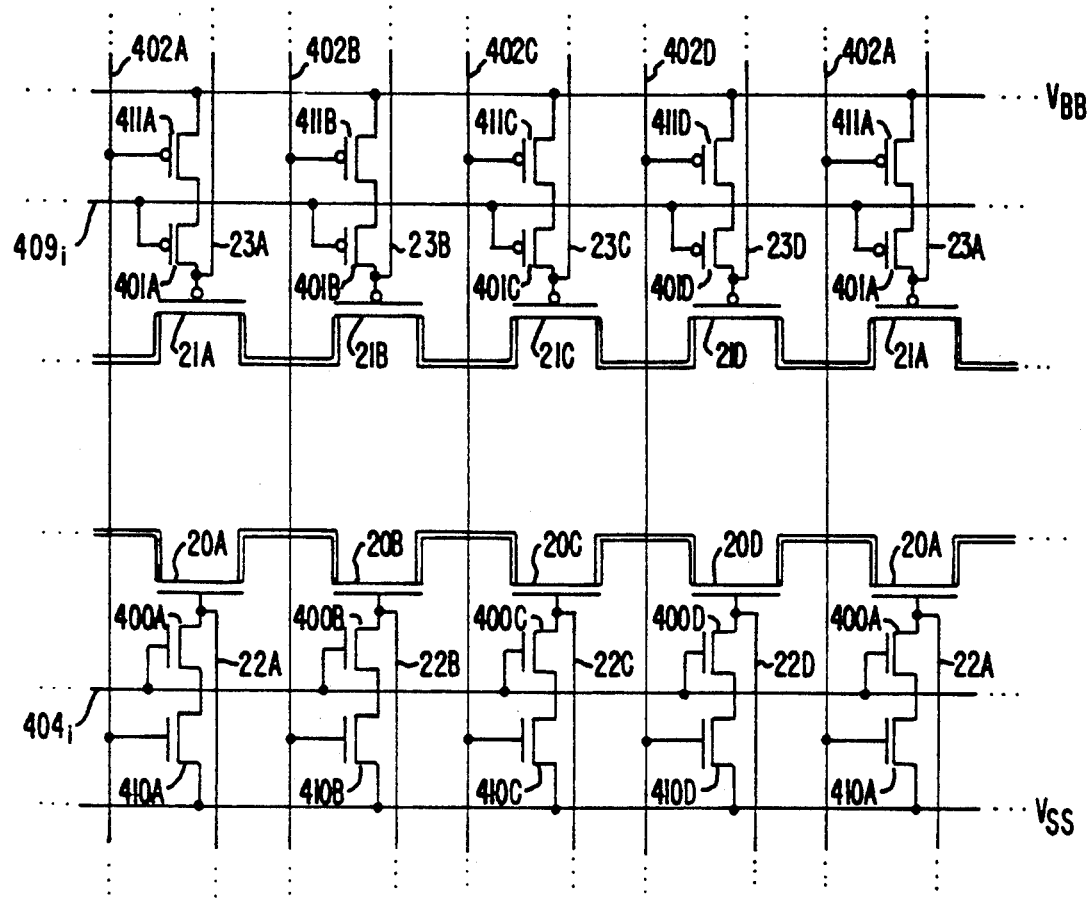
FIG. 13 details the isolation transistor circuitry for the transistors in the CST rows in the core array.

Besides the gate wiring segments 23A–23D discussed previously with respect to FIG. 3, each gate of each PMOS transistor 21A–21D (in a repeating cycle of four-tile group in a CST row 15) is also connected to a $V_{pb}$ pin through two series-connected PMOS transistors 401A–401D and 411A–411D, as shown in FIG. 13. The $V_{pb}$ pin provides another high positive voltage supply during programming. The first PMOS transistor 401A–401D has a drain connected to the gate of its respective transistor 21A–21D, a gate connected to a row P gate isolation control line 402$i$ (i representing an arbitrary ith row) and a source connected to the drain of a second PMOS transistor 411A–411D respectively. The second PMOS transistor 411A–411D has a gate connected to a corresponding column isolation control line 402A–402D and a source connected to the $V_{pb}$ pin. When both PMOS transistors 401A–401D and 411A–411D are enabled, the gate of the PMOS transistor 21A–21D in the CST row 15 is at $V_{pb}$, +10 volts during programming, and the transistor 21A–21D is turned off. No current can flow through the transistor.

In a similar fashion each gate of the NMOS transistors 20A–20D in the CST rows 15 is also connected to the CST row isolation circuits. The gate of each NMOS transistor 20A–20D is connected to the drain of a first NMOS transistor 400A–400D respectively. The NMOS transistor 400A–400D has its gate connected to a row N gate isolation control line 404$i$ and a source connected to the drain of a second NMOS transistor 410A–410D respectively. The second NMOS transistor 410A–410D has a gate connected to the corresponding column gate isolation control line 402A–402D and a source connected to the $V_{ss}$ pin.

The column isolation control lines 402A–402D, the row N gate isolation control lines 403$i$ and the row N gate isolation control lines 404$a$ are connected to decoding circuits which enable and disable the transistors 401A–401D, 400A–400D, 411A–411D and 410A–410D. A signal on each of the column isolation control lines 402A–402D enables either the PMOS transistors 411A–411D or the NMOS transistors 410A–410D in each column of the core array 11. A signal on each of the row P gate isolation control lines 403$i$ enables the PMOS transistors 401A–401D in the ith row of the array. A signal on each of the row N gate isolation control lines 404$a$ enables the NMOS transistors 400A–400D in the ith row of the array. By sending signals on these column and row control lines, the transistor at the intersection in the CST row 15 is turned off to ensure isolation.

Programming Rules and Sequence

To program the FPGA, antifuses are programmed to connect transistors and logic blocks into configured cells and to connect the cells together to make the desired digital logic circuit. As described above, the transistors of the CST rows 15 and LLbs 40 in the LLB rows 16 are connected to dedicated (i.e., already connected prior to any programming) wiring segments. Additional undedicated (i.e., unconnected prior to any programming) wiring segments, such as chevrons, track segments (found in the channels 17), and long lines, are available to accommodate any required circuit connection. Both dedicated and undedicated wiring segments intersect other dedicated or undedicated wiring segments with antifuses at most of the intersections. Thus selected antifuses are programmed to make the desired electrical connections to configure the wiring segments, CST transistors, and LLBs into the desired cells and to make the intercell connections.

As explained above, to make the connection between two wiring segments, one wiring segment is driven to the programming voltage $V_{pp}$ by the + address circuit (+X,+Y address signals and + programming grids) and the other wiring segment is driven to the programming voltage $V_{ss}$ by the − address circuit (−X,−Y address signals and − programming grids). The difference between the two programming voltages across the antifuse at the intersection of the two segments programs the antifuse.

Figures 14A, 14B, 14C:
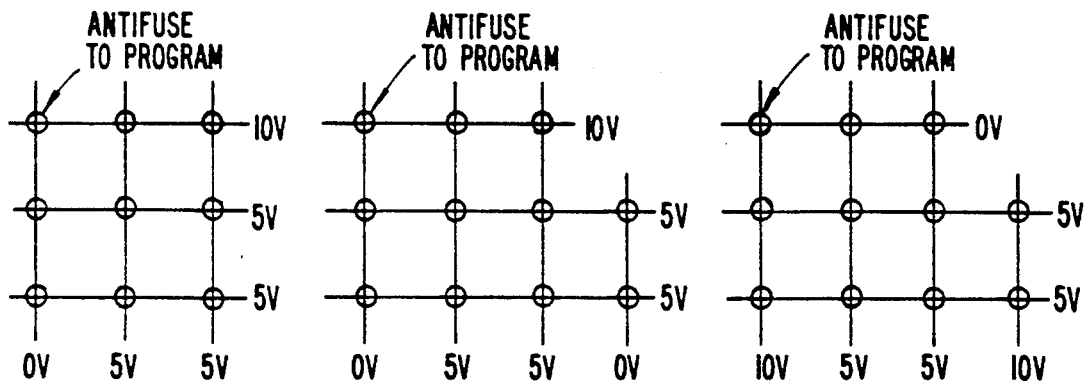
FIGS. 14A to 14C show different combinations of programming voltages in a grid of wiring segments.

However, the antifuses of the core array 11 cannot be programmed arbitrarily nor in random order. To program an antifuse element, $V_{pp}$ volts (+10 volts in the present embodiment) is applied across the terminals of the antifuse. The large programming transistors described previously apply the programming voltages to each of the intersecting wiring segments, either directly or indirectly through other wiring segments connected by previously programmed antifuses. All other line segments, except some gate segments driven to high voltages to isolate transistors in the CST rows 15, are subjected to an intermediate voltage $V_{pr}$ (+5 volts in this embodiment). This is illustrated in FIG. 14A. In this manner, at most a voltage of $V_{pp}-V_{pr}$ or $V_{pr}-V_{ss}$ is applied to any of the antifuses which are not to be programmed. Acceptable variations include subjecting some of the other line segments to $V_{pp}$ or some to $V_{ss}$, both, as illustrated in FIGS. 14B and 14C. Only voltages of 0, $V_{pp}-V_{pr}$ or $V_{pr}-V_{ss}$ are placed across the antifuses which are not to be programmed.

The transistors and cells of the FPGA must be connected with these constraints and without additional isolation devices.

Any method to program these antifuses must satisfy a number of important objectives which are:
1. To connect a connection of CST transistors to implement any arbitrary CMOS logic gate or cell;
2. To connect logic gates/cells to implement any arbitrary CMOS digital logic circuit;
3. To implement the above objectives with as few restrictions as possible;
4. To implement connections between transistors/cells and attain high performance (low capacitance and low resistance between connection points). A corollary to this objective is that no special isolation devices should be employed to aid objectives 1.-3. above, since such devices typically degrade performance.

Figure 15A:
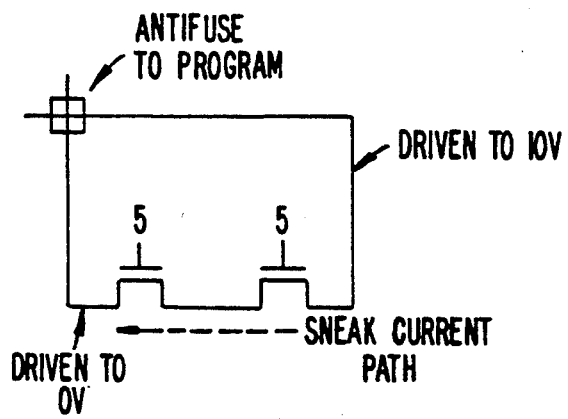
FIGS. 15A and 15B illustrate some problematical programming of wiring segments.
Figure 15B:
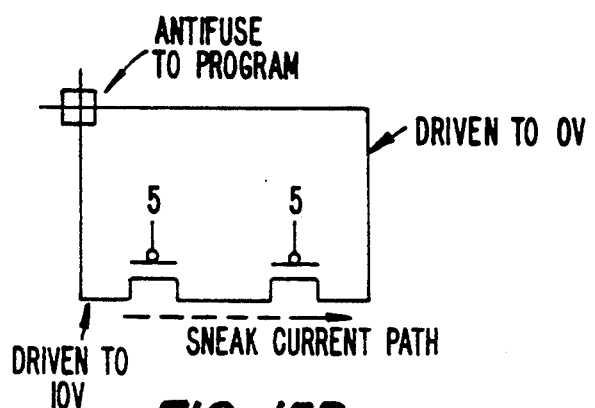

In order to meet objectives 1. and 2., only the intended antifuses must be guaranteed to be programmed. Otherwise, the wrong logic cell or circuit results. This implies that 1) only the intended antifuse can have 10 volts across it and all the other antifuses must have an intermediate voltage or less; and 2) current can flow through the intended antifuse only and no other (spurious) current path exists once 10 volts is applied. Two examples of this problem case are illustrated in FIGS. 15A and 15B. Hence for these cases, high voltages are applied to the gate segments of the transistors, invariably transistors in the CST rows 15, through which the spurious currents could flow. The high voltages, $V_{pp}$ or $V_{ss}$, applied by the isolation circuitry described above, ensure that these transistors are turned off to prevent current flow.

Figure 29:
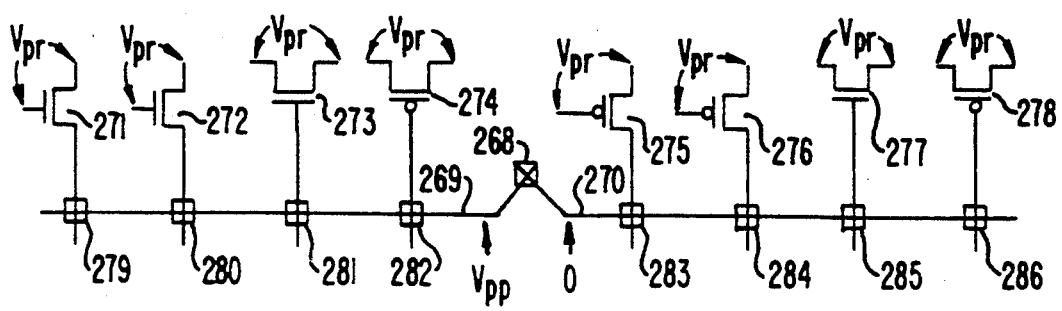
FIG. 29 illustrates a primary sequence for programming antifuses where routing is restricted.

The rules and sequence of programming set forth below satisfy the above objectives. The following rules are used to ensure that conditions 1) and 2) occur with respect to the transistors of the CST rows 15. The final results of these rules are that either one of the two primary sequences, or both, are followed to successfully program any logic cell or circuit. The first primary programming sequence which is explained with respect to FIG. 29 is followed if there are routing restrictions in making the desired connections, which typically occur for intercell connections. The second primary programming sequence which is explained with respect to FIGS. 30A and 30B is followed if there are placement restrictions in making the desired connections. This restriction typically occurs in the making of intracell connections.

These programing sequences overcome connection restrictions for configuring high performance logic cells and circuits in the disclosed architecture of the present invention.

Thus the following rules, from the simple to more complex, ensure the proper programming of the antifuses in the core array 11. The rules start as simple single steps and, as the circuit connections become more complicated, the rules follow a number of steps. Finally, the rules develop into the complex sequences which permit the proper programming of the array 11.

Gate connections in the absence of preconnected transistor source/drains do not present special difficulties nor special rules. MOS transistors are inherently isolated. Thus the rules discussed with respect to FIGS. 16A, 16B, 17A, 17B and 18 provide for the programming of CMOS transistors in the CST rows 15 without other current paths or other nodes going to +10 or 0 volts. Only source/drain connections to the transistors are considered.

Figure 16A:
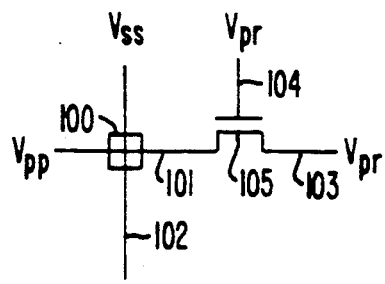
FIGS. 16A and 16B illustrate a programming rule with an antifuse at the intersection of an undedicated wiring segment and a segment connected to a source/drain of a transistor.

FIG. 16A illustrates the programming of an antifuse 100 at the intersection between a wiring segment 101 connected to one of the source/drains of a NMOS transistor 105 and a wiring segment 102 which is not connected to a transistor, such as an unconnected vertical chevron in the CST row 15. The goal is to place $V_{pp}$ across the antifuse 100 without turning on the transistor 105. This is achieved by driving the wiring segment 101 to $V_{pp}$, +10 volts, and the wiring segment 102 to $V_{ss}$, 0 volts. A voltage difference of $V_{pp}$ is placed across the antifuse 100. The wiring segments 103 and 104 which are respectively connected to the other source/drain and the gate of the transistor 105 are held at $V_{pr}$, the intermediate voltage of +5 volts. The NMOS transistor 105 remains off because the $V_{GS}$, the source-gate voltage, is zero and the transistor is turned off.

Note that this procedure is also applicable to other NMOS transistors having a source/drain connected to the segment 101. These connections may be in series, in parallel, or a combination of both, with the NMOS transistor 105. These connections may include those made by previously programmed antifuses.

Figure 16B:
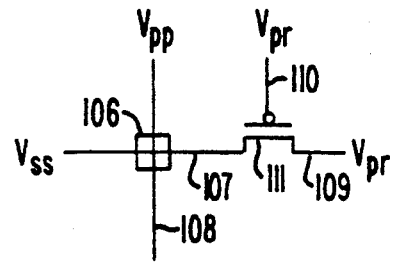

Similarly, FIG. 16B illustrates the complementary example. An antifuse 106 between a wiring segment 107 connected to a source/drain of a PMOS transistor 111 and an unconnected wiring segment 108 must be programmed. Here the wiring segment 107 is set to $V_{ss}$, 0 volts, and the wiring segment 108 to $V_{pp}$, +10 volts. A voltage drop of 10 volts occurs across the antifuse 106.

The wiring segments 109 and 110 respectively connected to the other source/drain and the gate of the transistor 111 are set to $V_{pr}$, +5 volts. The transistor 111 is turned off because the source-gate voltage, $V_{GS}$, is zero.

Note that this procedure is also applicable to other PMOS transistors having a source/drain connected to the segment 107. These connections may be in series, in parallel or a combination of both, with the PMOS transistor 111. These connections may include those made by previously programmed antifuses.

Figure 17A:
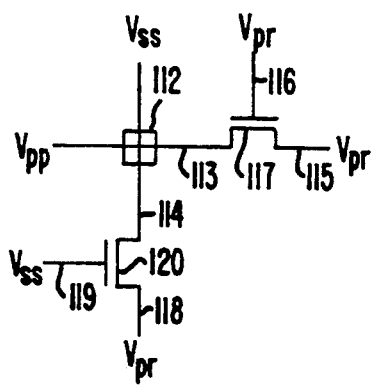
FIGS. 17A and 17B illustrate a programming rule with an antifuse at the intersection of two wiring segments, each segment connected to the source/drains of opposite polarity transistors.
Figure 17B:
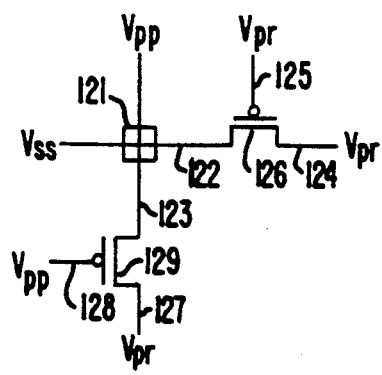

FIGS. 17A and 17B illustrate the programming of an antifuse at the intersection of two wiring segments, each of which is connected to the source/drain of an MOS transistor. The two transistors are of the same polarity type.

In FIG. 17A the two transistors 117 and 120 are NMOS type. The transistor 117 has one of its source/drains connected to a wiring segment 113; the other source/drain is connected to a wiring segment 115 and the gate of the transistor 117 to the segment 116. The transistor 120 has one of its source/drains connected to a wiring segment 114; the other source/drain is connected to a wiring segment 118 and the gate of the transistor 120 to a segment 119. The two segments 114 and 113 intersect with the antifuse 112 in between.

To program the antifuse 112, one of the intersecting segments, say, segment 113, is raised to $V_{pp}$. The other segment 114 is lowered to $V_{ss}$. A $V_{pp}$ voltage drop is created across the antifuse 112. The NMOS transistor 117, which has its segment 113 raised to a programming voltage, has the wiring segments 115 and 116 connected to the other source/drain and gate set to the intermediate voltage $V_{pr}$. Since the gate electrode voltage is the same as the lower of the two source/drain voltages, i.e., the voltage on the segment 115, the source-gate voltage ($V_{GS}$) of the NMOS transistor 117 is zero. The transistor 117 remains off.

The NMOS transistor 120, which has its segment 114 lowered to a programming voltage, has the wiring segment 118 connected to the other source/drain set to the intermediate voltage $V_{pr}$. However, the wiring segment 119 connected to the gate is driven to $V_{ss}$, 0 volts, by the isolation circuitry. The source-gate voltage ($V_{GS}$) of this transistor 120 is also zero, since the gate has the same voltage as the lower of the two source/drain voltages, i.e., the voltage on the segment 114. The transistor 120 is off.

In FIG. 17B the polarities of the two transistors are reversed. The two PMOS transistors 126 and 129, each have a source/drain respectively connected to intersecting wiring segments 122 and 123. The PMOS transistor 126 has a wiring segment 124 connected to its other source/drain and a wiring segment 125 connected to its gate. The PMOS transistor 129 has a wiring segment 127 connected to its other source/drain and a wiring segment 128 connected to its gate.

To program an antifuse 121 between the segments 122 and 123, one segment, say segment 123, is driven high to $V_{pp}$ and the other, segment 122, low to $V_{ss}$. In this case, the transistor 126, which has its segment 122 driven low, has both wiring segments 124 and 125 respectively connected to the other source/drain and the gate electrode set to the intermediate voltage $V_{pr}$ to keep the transistor 126 turned off. $V_{GS}$ is zero since the gate voltage (+5 volts) is the same as the higher of the two source/drain voltages, i.e., the voltage on the segment 124.

The transistor 129, which has its segment 123 at the higher programming voltage, has its source/drain wiring segment 127 set to $V_{pr}$, while its gate wiring segment 128 is driven high to $V_{pp}$ by the isolation circuitry. The transistor 129 remains off because $V_{GS}$ is zero.

In both cases illustrated in FIGS. 17A and 17B, additional like-polarity transistors can also be connected by their source/drains to the intersecting wiring segments. The connections may be in series or parallel, or combinations of both, with the transistors in the drawings. By analogously using the same voltages on the wiring segments connected to source/drains and gates of the additional transistors, the programming of the antifuse at the intersection of the wiring segments is performed.

For example, additional NMOS transistors can be connected in parallel with the NMOS transistor 120 in the illustration in FIG. 17A. Programming can be performed by setting the same voltages on the wiring segments, i.e., $V_{ss}$ on the gates and $V_{pr}$ on the source/drain not connected to the segment 114, of the additional transistors. Another example is an additional PMOS in FIG. 17B, which transistor has a source/drain connected to the segment 122 in series with the source/drain region also connected to the segment 122 of the transistor 126. Programming is performed by setting segments connected to the other source/drain and gate of the additional PMOS transistor to $V_{pr}$, as for the transistor 116.

It should be noted that these parallel and series connections may include those made by previously programmed antifuses.

Figure 18:
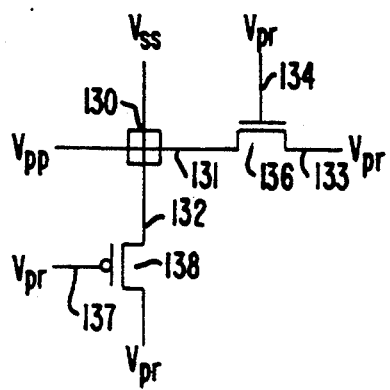
FIG. 18 illustrates a programming rule for an antifuse at the intersection of a wiring segment connected to a source/drain of a transistor and a second segment connected to a source/drain of a second transistor of the same polarity.

FIG. 18 shows how to program an antifuse 130 at the intersection of two wiring segments 131 and 132. Again these wiring segments themselves may be wiring segments connected together by previously programmed antifuses. The wiring segment 131 is connected to a source/drain of a NMOS transistor 135. The wiring segment 132 is connected to a source/drain of a PMOS transistor 138. Wiring segments 133 and 134 are respectively connected to the other source/drain and gate of the NMOS transistor 135; wiring segments 137 and 136 are respectively connected to the gate and other source/drain of the PMOS transistor 138.

To program the antifuse 130, the wiring segment 131 connected to the NMOS transistor 135 is raised to $V_{pp}$ and the lowered to $V_{ss}$. The wiring segments connected to the other source/drain and gate of both transistors 135 and 138 are left to the intermediate voltage $V_{pr}$.

Note again that additional NMOS transistors connected (including connections through previously programmed antifuses) in parallel with the NMOS transistor 135 may be correspondingly set to the same programming voltages to achieve the programming of the antifuse 130. An additional NMOS transistor connected in series with the NMOS transistor 135, i.e., connected by a source/drain to the segment 131 on the other side of the antifuse 130 also programs the antifuse if the wiring segments connected to the transistor's other source/drain and gate are correspondingly set to the same voltages as the transistor 135.

The same is true for additional PMOS transistors connected in parallel (or in series) with the PMOS transistor 138.

Figure 19A:
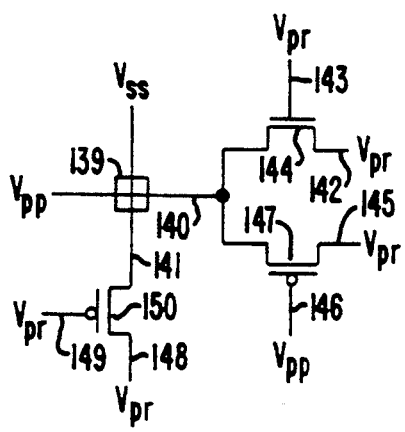
FIGS. 19A and 19B illustrate a programming rule with an antifuse at the intersection of a first wiring segment connected in paralle to the source/drains of NMOS and PMOS transistors and a second wiring segment connected to the source/drain of a PMOS transistor.
Figure 19B:
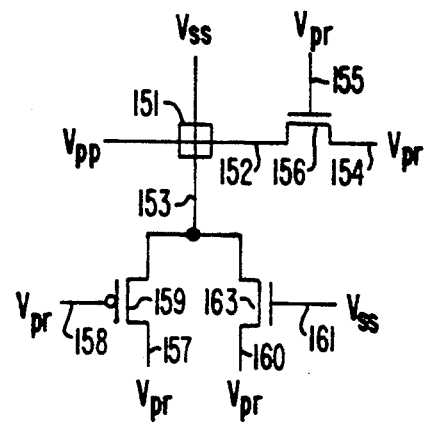
Figure 19C:
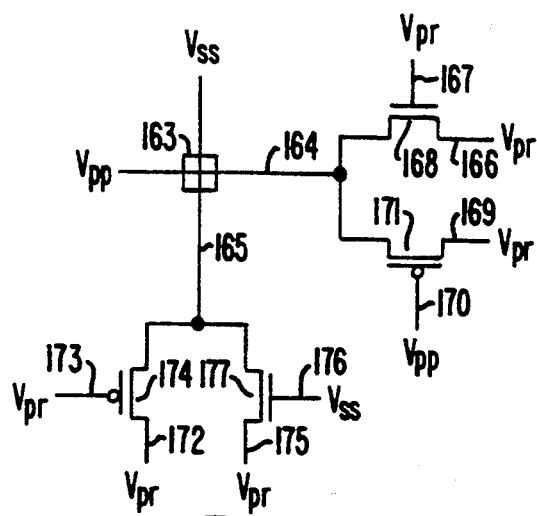
in FIG. 19C the second wiring segment is also connected in parallel to the source/drain of NMOS and PMOS transistors.

FIGS. 19A through 19C illustrate the programming rule of an antifuse at the intersection of two wiring segments. Each wiring segment is connected to a source/drain of an MOS transistor, but at least one of the segments is connected in parallel to the source/drains of two MOS transistors of opposite polarity.

In FIG. 19A an antifuse 139 is located at the intersection of two wiring segments 140 and 141. The wiring segment 140 is connected in parallel to the source/drains of a PMOS transistor 144 and a NMOS transistor 147. The wiring segment is connected to a source/drain of a PMOS transistor 150. To program the antifuse 139, the segment 141 connected to the source/drain of the single PMOS transistor 150 is driven to $V_{ss}$ and the segment 140 connected to the source/drains of the parallel NMOS and PMOS transistors 144 and 147 to $V_{pp}$. The wiring segments 142, 145 and 148 connected to the other source/drains of the all the transistors are held at the intermediate programming voltage $V_{pr}$. The wiring segment 149 connected to the gate of the PMOS transistor 150 is also held at $V_{pr}$, along with the wiring segment 143 connected to the gate of the NMOS transistor 144. The transistors 144 and 150 remain off. On the other hand, the wiring segment 146 connected to the gate of the PMOS transistor 147 which has a source/drain driven to $V_{pp}$ is driven to $V_{pp}$. This ensures that the PMOS transistor 147 remains off.

The programming example shown in FIG. 19B is the complementary to that in FIG. 19A. In FIG. 19B the single transistor is a NMOS transistor 156 which has a source/drain connected to an intersecting wiring segment 152. The parallel-connected transistors to a wiring segment 153 are PMOS transistor 159 and NMOS transistor 162. To program an antifuse 51 at the intersection of the two segments 152 and 153, the segment 152 connected to the single NMOS transistor 156 is driven to $V_{pp}$ and the parallel-connected segment 153 to $V_{ss}$. The wiring segments 154, 157 and 160 connected to the other source/drains of the transistors 156, 159 and 162 are held at $V_{pr}$, along with the wiring segments 155 and 158 connected to the gates of the single NMOS transistor 156 and parallel-connected PMOS transistor 159. The two transistors 156 and 159 remain off. On the other hand, the wiring segment 161 connected to the gate of the parallel-connected NMOS transistor 163 is driven low to $V_{ss}$ to keep the transistor turned off.

Thus the rule from FIGS. 19A and 19B is that where a NMOS transistor has a source/drain driven to $V_{pp}$, its other source/drain and gate are left at $V_{pr}$ for programming. Where the NMOS transistor's source/drain is driven to $V_{ss}$, then the other source/drain is left at $V_{pr}$, but the gate is driven to $V_{ss}$. In the complementary case of a PMOS transistor, both its gate and a source/drain are left at $V_{pr}$ when its first source/drain is driven to $V_{ss}$. If the source/drain of the PMOS transistor is driven to $V_{pp}$, then the gate must also be raised to $V_{pp}$. Thus the rule is applicable for more transistors, PMOS and NMOS, which may be connected to the intersecting segments either in parallel or in series. These connections may include those made by previously programmed antifuses.

This is illustrated in FIG. 19C where each of the intersecting wiring segments is connected to the source/drains of parallel transistors of opposite polarity. In FIG. 19C the intersecting segments 164 and 165 are each connected to the source/drains of NMOS and PMOS transistors. The segment 164 is connected to a NMOS transistor 168 and a PMOS transistor 171. The segment 165 is connected to a NMOS transistor 176 and a PMOS transistor 173. To program an antifuse 163 at the intersection of the segments 164 and 165, the wiring segments connected to the other source/drains of all the transistors 168, 171, 174 and 177 are held at $V_{pr}$.

With one of the intersecting segments driven to $V_{pp}$, in this case the segment 163, the gate of the NMOS transistor 167 is left at $V_{pr}$, but the gate of the PMOS transistor 171 is driven to $V_{pp}$ to keep the PMOS transistor 171 off. The other intersecting segment 165 is driven to $V_{ss}$ so that the gate of the PMOS transistor is left at $V_{pr}$. The gate of the NMOS transistor 177, on the other hand, is driven to $V_{ss}$.

FIGS. 20A-20D, 21A-21D illustrate the extension of the programming rules to connect the gate-connected segment of a transistor to nodes with preconnected source/drain-connected wiring segments of other transistors. As illustrated below, the general rule is to keep the wiring segments to both of the source/drains of the gate-connected transistor at $V_{pr}$ so that even if the transistor is turned on, no current flows because $V_{DS}$, the source-drain voltage of the transistor, is zero. On the other hand, the wiring segments connected to the gates of the source/drain-connected transistors are driven or held at whatever voltages are required to keep the transistors off, i.e., $V_{GS}$ of these transistors, is zero.

Figure 20A:
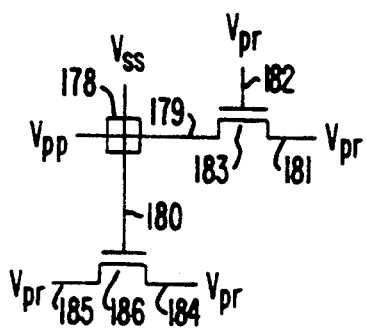
FIGS. 20A through 20D and 21A through 21D illustrate various rules for programming an antifuse at the intersection of a wiring segment connected to a source/drain of a transistor and a segment connected to a source/drain of a second transistor.

The general rule may be clearer by an examination of a specific example. In FIG. 20A, the segment 179 connected to a source/drain of a NMOS transistor 183 is to be connected to the wiring segment 180 connected to the gate of a NMOS transistor 186. To program the antifuse 178, the segment 179 is driven to the programming voltage $V_{pp}$ and the other intersecting segment is driven to $V_{ss}$. Both the source/drains of gate-connected transistor 186 and the gate of the source/drain connected transistor 183 are kept at $V_{pr}$. In this case both transistors 183 and 186 are kept off.

Figure 20B:
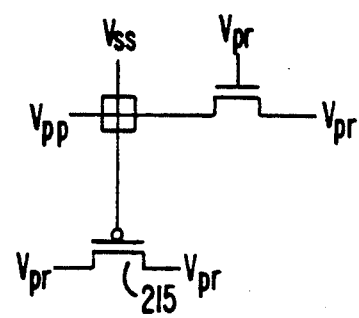

This is not so for the example in FIG. 20B where a PMOS transistor 215 is substituted for the NMOS transistor 186 of FIG. 20A. As can be seen in FIG. 20B, the same programming voltages are used. In this case, the transistor 215, being PMSO and having its gate driven to $V_{ss}$ and its source/drains to $V_{pr}$, is turned on. However, since both of the source/drain regions of the gate-connected transistor 215 are at the same voltage, no current flows through the transistor.

Figure 20C:
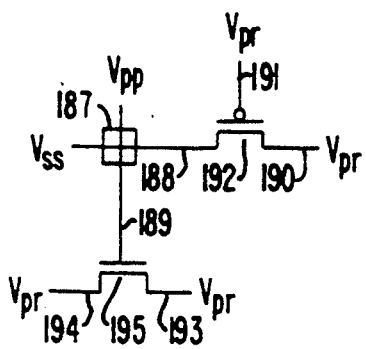

In FIG. 20C a PMOS transistor 192 has a source/drain connected to a wiring segment 188 which intersects another segment 189. The segment 189 is connected to a gate of a NMOS transistor 195. To keep the transistor 195 turned off while programming the antifuse 187 between the segments 188 and 189, the segment 188 is driven to $V_{ss}$ and the segments 190 and 191 respectively connected to the other source/drain of the transistor 192 are set to $V_{pr}$. $V_{GS}$ of the PMOS transistor 192 is zero. The wiring segments 193 and 194 connected to the source/drains of the gate-connected NMOS transistor 195 are both set at $V_{pr}$ also. $V_{GS}$ of the NMOS transistor 195 is positive and the transistor is turned on. However, no current flows through the transistor 195 since $V_{DS}$, the source-drain voltage is zero.

Figure 20D:
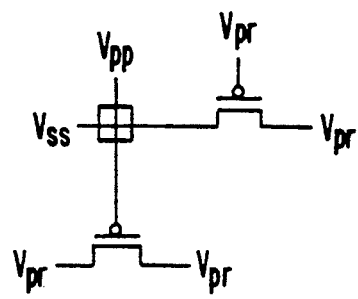

In FIG. 20D a PMOS transistor 216 is substituted for the gate-connected NMOS transistor 195 in FIG. 20C. With the same programming voltages as in FIG. 20C, the both the transistors in FIG. 20D are kept off during the programming of the antifuse at the intersecting wiring segments.

FIGS. 21A through 21D respectively illustrate the same circuits as FIGS. 20A through 20D discussed above. However, the programming voltages on the intersecting wiring segments are reversed. The result is that the programming voltages on the gates of the source/drain-connected transistors are changed to keep the transistors turned off.

For example, the wiring segment 197 connected to a source/drain of a NMOS transistor 201 is driven to $V_{ss}$, while the wiring segment 198 connected to the gate of a NMOS transistor 204 is driven to $V_{pp}$. To program the antifuse 196 at the intersection of the two segments 197 and 198, the wiring segments 202 and 203 connected to the two source/drains of the gate-connected transistor 204 are both kept at $V_{pr}$ to keep current from flowing through the transistor. To keep the source/drain-connected transistor 201 turned off, the other source/drain of the transistor is kept at $V_{pr}$ and the gate of the transistor is driven to $V_{ss}$. This renders $V_{GS}$ of the transistor 201 zero.

Figure 21A:
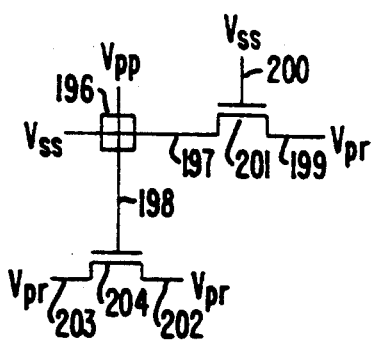
Figure 21B:
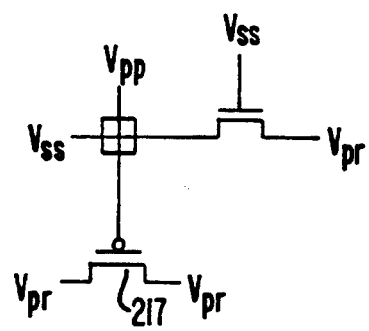

In FIG. 21B a PMOS transistor 217 is substituted for the NMOS transistor 204 in FIG. 21A. The same programming voltages are applied to the corresponding wiring segments of the transistors in FIG. 21B. In this case the gate-connected PMOS transistor 217 is off because $V_{GS}$ of the transistor is negative ($-5$ volts). The source/drain-connected transistor is off also for the same reasons that the corresponding NMOS transistor 201 in FIG. 21A is off.

Figure 21C:
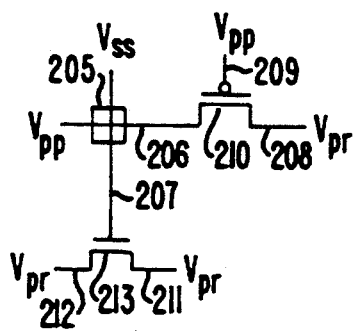

In FIG. 21C a wiring segment 206 is connected to a source/drain of a PMOS transistor 210. The segment 206 intersects a wiring segment 207 which is connected to a gate of a NMOS transistor 213. To program an antifuse 205 at the intersection of the segments 206 and 207, the segment 206 is driven to $V_{pp}$ and the segment 207 to $V_{ss}$. With both segments 211 and 212 connected to the source/drains of the gate-connected transistor 213 set at $V_{pr}$, the transistor 213 is off because $V_{GS}$ is negative. For the source/drain-connected PMOS transistor 210, the wiring segment 208 connected to the other source/drain of the transistor is set at $V_{pr}$. To keep the gate is driven to $V_{pp}$.

Figure 21D:
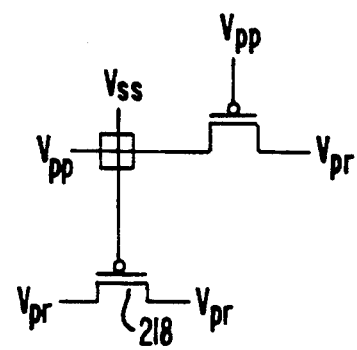
Figure 22A:
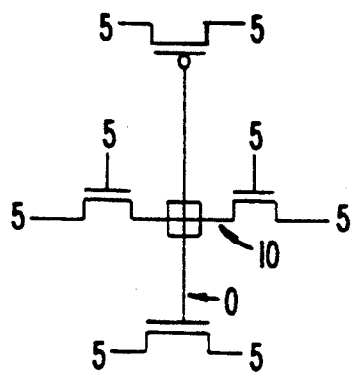
FIGS. 22A through 22H illustrate various rules for programming an antifuse at the intersection of a first wiring segment connected to the gate of a transistor at either end of the segment and a second wiring segment connected to the source/drains and gates of various transistors.
Figure 22B:
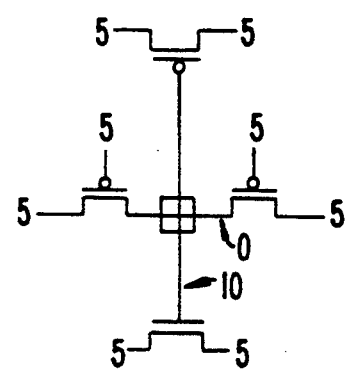
Figure 22C:
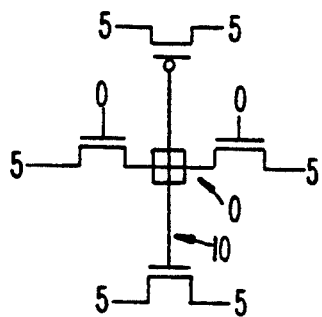
Figure 22D:
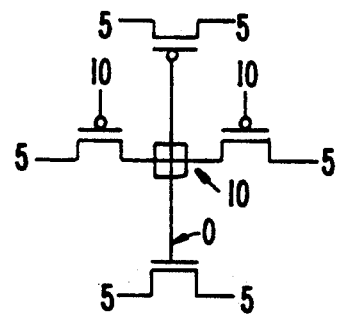
Figure 22E:
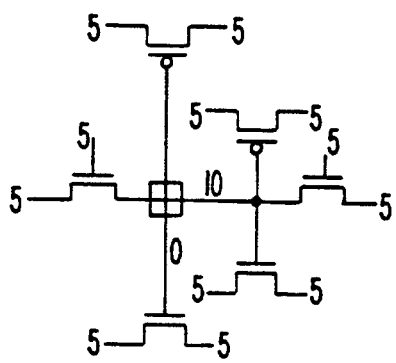
Figure 22F:
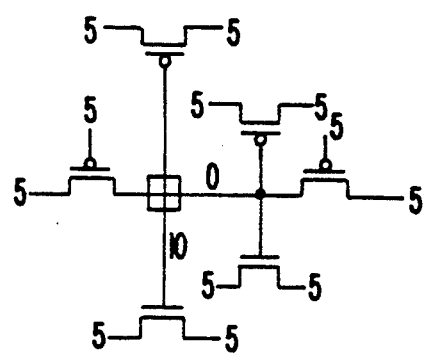
Figure 22G:
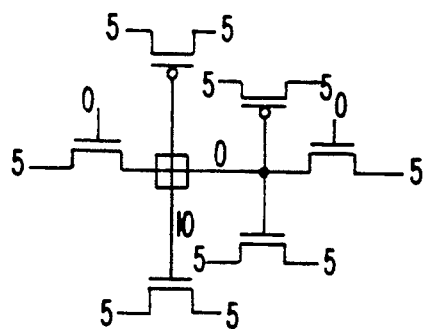
Figure 22H:
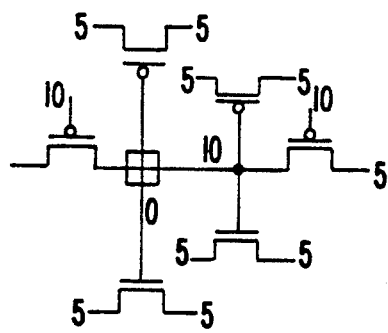

In FIG. 21D the gate-connected NMOS 213 in FIG. 21C is replaced with a PMOS transistor 218. The same programming voltages as in FIG. 21C are applied. In this case the gate-connected transistor 218 is turned on, but the intermediate voltage $V_{pr}$ on both source/drains of the transistor prevents current flow through the transistor 218.

The rules illustrated by FIGS. 20A through 20D and 21A through 21D of course can be generalized. Series and parallel-connected transistors can be added to the illustrated circuits and the same programming rules applied. FIGS. 22A through 22H show various combinations of added transistors, both source/drain-connected and gate-connected. In all of the combinations shown, a second source/drain-connected transistor has been connected in series with the first source/drain-connected transistor with different combinations of gate-connected transistors. These connections may include those made by previously programmed antifuses.

The following rules relate to more gate-connected transistors. The rules discussed with respect to FIGS. 23A, 23B through 28 are based on the previous rules. In the context of the CST rows 15, the rules are applicable for the programming of the local chevrons and other similar wiring segments. An important point is that the antifuses to the gate-connected wiring segments are not programmed even when isolation is required.

Figure 23A:
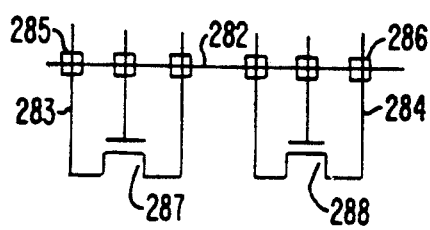
FIG. 23A and 23B illustrate programming rules for antifuses at the intersections of a wiring segment which crosses all the wiring segments connected to the source/drains and gates of two transistors of the same polarity.

FIG. 23A shows two NMOS transistors 287 and 288, each having their two source/drain-connected and gate-connected wiring segments intersecting a common wiring segment 282. Antifuses are located at each of the intersections. The rule shows how to connect one of the source/drains of each of the NMOS transistors 287 and 288 to the common segment 282.

In FIG. 23A the source/drain-connected segment 283 of the transistor 287 and the source/drain-connected segment 286 of the transistor 288, both segments being arbitrarily selected, are to be connected to the common segment 282. To make the first connection, say the segment 283 to the segment 282, the common segment 282 is set to $V_{ss}$, 0 volts, and the source/drain connected segment 283 of the transistor 287 is set to $V_{pp}$, $+10$ volts. The other source/drain-connected wiring segment and the gate-connected segment of the transistor 287 are set to $V_{pr}$, $+5$ volts. Similarly, all the wiring segments to the transistor are also set to $V_{pr}$. The antifuse 285 is programmed to connect the segments 282 and 283.

Then the second connection must be made between the segments 282 and 284. In this step the common segment 282 is again set to $V_{ss}$ and the source/drain-connected segment 284 of the transistor 288 to $V_{pp}$ to program the antifuse 286. The other source/drain-connected segment and the gate-connected segment of the transistor 288 are set to $V_{pr}$. The other source/drain-connected wiring segment of the transistor 287, which already has a source/drain connected to the common segment 282, is set to $V_{pr}$. On the other hand, the gate-segment connected segment of the transistor 287 is set to $V_{ss}$. The antifuse 286 is programmed with the transistors 287 and 288 kept turned off.

Figure 23B:
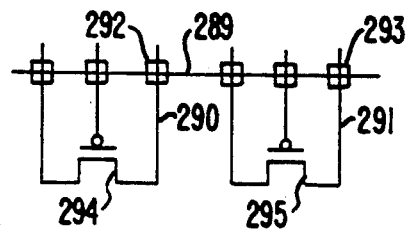

The two-step procedure is also followed for the two PMOS transistors 294 and 295 in FIG. 23B with the appropriate changes in programming voltage polarities. To make the first connection, say, the segment 290 of the PMOS transistor 294 to the common segment 289, the common segment is set to $V_{ss}$ and the segment 290 to $V_{pp}$. All the other segments connected to the transistors 294 and 295 are set to the intermediate programming voltage $V_{pr}$. The antifuse 292 is programmed.

To connect one of the source/drains of the second transistor 295 to the common segment 289, i.e., connecting arbitrarily selected segment 291 to the segment 289, the following programming voltages are set. The common segment 289 is set to 0 volts and the segment 291 of the transistor 295 to $+10$ volts. The gate-connected segment and the other source/drain-connected segment of the transistor 294 are set to $+10$ and $+5$ volts respectively. For the transistor 295 being connected, its gate-connected segment and the other source/drain-connected segment are set to $+5$ volts. The antifuse 293 is programmed with the PMOS transistors 294 and 295 kept turned off.

Figure 24A:
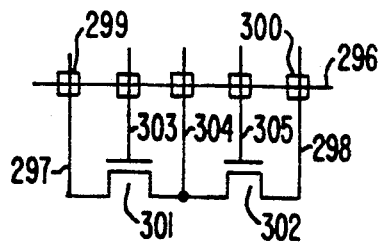
FIG. 24A and 24B illustrate the programming rules for similar arrangements as in FIG. 22A and 22B, except that one of the source/drains is common to the two transistors.
Figure 24B:
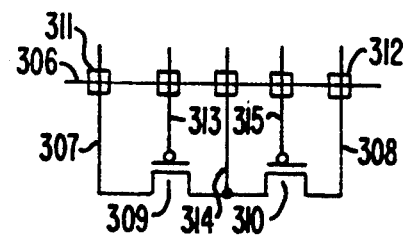

FIGS. 24A and 24B illustrate the programming rules for connecting a source/drain of each of two transistors of similar polarity to a common wiring segment. The two transistors share a common source/drain which is not connected to the common wiring segment. All of the source/drain-connected and gate-connected segments of the two transistors intersect the common segment with antifuses between the segments.

Thus in FIG. 24A the wiring segments 297 and 298 of two NMOS transistors 301 and 302 are to be connected to a common segment 296 by programming the antifuses 299 and 300. To program the antifuse 299 first, for example, the common segment 296 is set to 0 volts and the segment 297 to $+10$ volts. All the other segments 298 and 303-305 are set to $+5$ volts.

Then to program the antifuse 300, the common segment 296, along with the gate-connected segment 303 of the already connected transistor 301, is set to 0 volts and the source-drain-connected segment 298 of the transistor 302 to +10 volts. The common source/drain-connected segment 304 and the gate-connected segment 305 of the transistor 302 are set to +5 volts. The antifuse 300 is programmed with the NMOS transistors 301 and 302 off.

FIG. 24B illustrates the programming rule with two PMOS transistors 309 and 310. To make the first connection between the common segment 306 and the segment 307, the common segment 306 is set to +10 volts and the source/drain-connected segment 307 to 0 volts. The remaining segments 308, 313-315 are set to +5 volts. The antifuse 311 is programmed with the PMOS transistors 309 and 310 off.

Then to make the connection between the common segment 306 and the source/drain-connected segment 308 of the remaining transistor 310, the segment 308 is set to 0 volts. The common segment 306 and the gate-connected of the already connected transistor 309 are set to +10 volts. The common source/drain-connected segment 314 and the gate-connected electrode of the transistor 310 are set to the intermediate +5 volts. The antifuse 312 is programmed with the PMOS transistors 309 and 310 remaining off.

Figure 25:
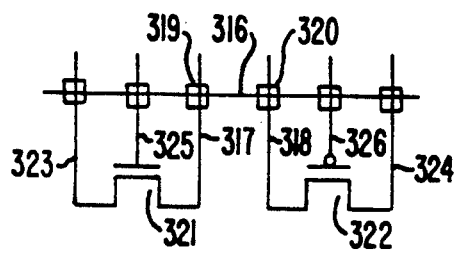
FIG. 25 illustrates the programming rule for antifuses at the intersections of a wiring segment which crosses all the wiring segments connected to the source/drains and gates of two transistors of the different polarities.

FIG. 25 illustrates the programming rule for two complementary transistors, each having source/drain-connected wiring segments and gate-connected segments intersecting a common segment with antifuses at each intersection. By following the rule, a source/drain of one NMOS transistor and a source/drain of one PMOS transistor can be connected to the common wiring segment.

In FIG. 25 the source/drains of the NMOS transistor 321 and PMOS transistor 322 are arbitrarily selected to be those connected to the segments 317 and 318 respectively. To connect the segment 317 to the common segment 316, the common segment 316 is set to 0 volts and the segment 317 to +10 volts. The other wiring segments 318, 323-326 are set to +5 volts. The antifuse 319 is programmed with the NMOS transistor 321 and PMOS transistor 322 turned off.

To connect the segment 318 to the common wiring segment 316, the segment 318 is set to 0 volts and the common segment 316 to +10 volts. The other segments 323-326 are set to +5 volts and the antifuse 320 is programmed. The transistors 321 and 322 remain off.

It should be noted that the order of these two steps can be reversed to achieve the same result. In other words, the programming rule illustrated by FIG. 25 is independent of the order of the steps.

FIGS. 23A through 25 can be generalized to have more PMOS and NMOS transistors in series, in parallel, or a combination of both. FIGS. 26A, 26B, 27A, 27B and 28 illustrate some generalizations of the rule associated with FIG. 25 and those associated with FIGS. 23A, 23B, 24A and 24B. The combinations in FIG. 26A, 26B, 27A, 27B and 28 have three or four (FIG. 28) NMOS and PMOS transistors, each having their two source/drain-connected and gate electrode-connected wiring segments intersecting a common wiring segment. Antifuses are located at each of the intersections. The transistor of the same polarity may or may not have a common source/drain (and a common source/drain wiring segment). The rules show how to connect one of the source/drains of each of the MOS transistors to the common segment.

In all the programming rules associated with FIGS. 26A, 26B, 27A, 27B and 28, the NMOS and PMOS transistors are considered separately in accordance with the rule associated with FIG. 25. Then each group of NMOS and PMOS transistors are programmed separately in accordance with the applicable rules associated with FIGS. 23A, 23B, 24A and 24B. It does not matter which group of transistors is programmed first.

Figure 26A:
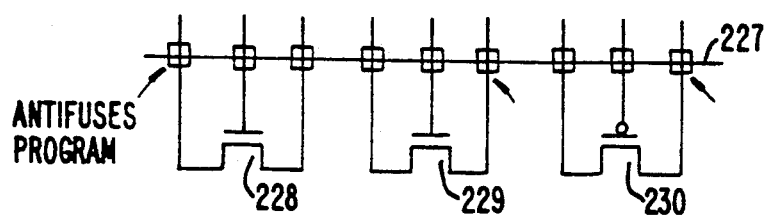
FIGS. 26A and 26B illustrate the programming rules for antifuses at the intersections of a wiring segment which crosses all wiring segments connected to the source/drains and gates of three transistors of which one transistor having a different polarity from the other two.

For example, in FIG. 26A the source/drains of two NMOS transistors 228 and 229 and one PMOS transistor 230 are to be connected to a common wiring segment 227. To program the antifuses indicated by arrows at the intersections of the source/drain-connected wiring segments for the NMOS transistors 228 and 229 and the common segment 227, the rule described with respect to FIG. 23A is followed. Then to program the indicated antifuse to make the source/drain connection for the PMOS transistor 230, the rule described with respect to FIG. 25 is followed. Again it should be noted that the PMOS and NMOS transistor programming order may be reversed.

Figure 26B:
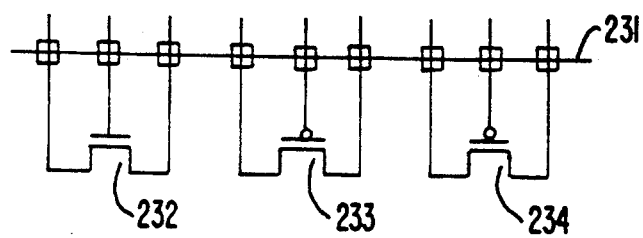

To connect the source/drains of the single NMOS transistor 232 and the two PMOS transistors 233 and 234 to the common wiring segment 231 in FIG. 26B, the rules associated with FIG. 25 and FIG. 23B are followed.

Figure 27A:
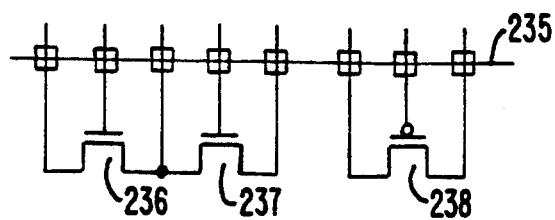
FIGS. 27A and 27B illustrate the programming rules for antifuses at the intersections of a wiring segment which crosses all wiring segments connected to the source/drains and gates of three transistors. One transistor has a different polarity from the other two, which share a common source/drain.
Figure 27B:
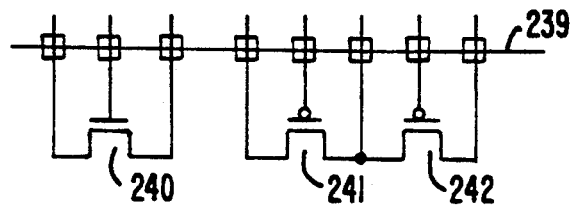

In FIGS. 27A and 27B the two transistors of the same polarity have a common source/drain. Thus in FIG. 27A two NMOS transistors 236 and 237 have a common source/drain-connected wiring segment. To connect the other two source/drain-connected segments of the NMOS transistors 236 and 237 and one of the source/drain-connected segments of the PMOS transistor 238 to the common wiring segment, the rules associated with FIG. 25 and FIG. 24A are followed. Similarly the rules associated with FIG. 25 and FIG. 24B are followed to program the source/drains of the single NMOS transistor 240 and the two PMOS transistors 241 and 242 with a common source/drain.

Figure 28:
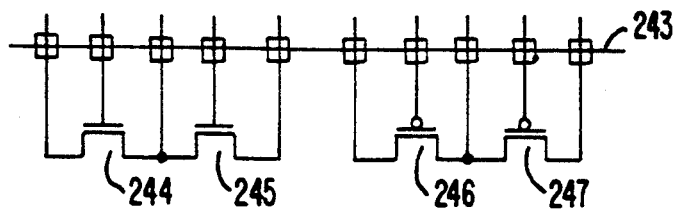
FIG. 28 illustrates the programming rule for antifuses at the intersections of a wiring segment which crosses all wiring segments connected to the source/drains and gates of two transistor pairs. The transistor pairs have different polarities and each pair shares a common source/drain.

In FIG. 28 the rules associated with FIGS. 25, 24A and 24B are applied. In FIG. 28 two NMOS transistors 244 and 245, having a common source/drain, and two PMOS transistors 246 and 247, also having a common source/drain, must have their remaining source/drains connected to a common wiring segment 243. By the rule associated with FIG. 25, the group of NMOS transistors 244 and 245 and the group of PMOS transistors 246 and 247 are treated separately. The antifuses for the NMOS transistors 244 and 245 are programmed according to the FIG. 24A rule, while setting the voltages for the PMOS transistors 246 and 247 according to the FIG. 25 rule. Conversely, the antifuses for the PMOS transistors 246 and 247 are programmed according to the FIG. 24B rule, while setting the voltages for the NMOS transistors 244 and 245 according to the FIG. 25 rule.

FIG. 29 helps explain a primary programming sequence for connecting together the source/drains of one or more NMOS transistors, the source/drains of one or more PMOS transistors, and the gates of one or more NMOS or PMOS transistors. This sequence is useful in making connections where there are routing restrictions and is used typically for intercell connections.

In FIG. 29 the NMOS transistors 271 and 272 represent all the NMOS transistors having source/drains to be connected, and the PMOS transistors 275 and 276 represent all the PMOS transistors having source/-drains to be connected. Transistors 273 and 277 represent NMOS transistors having gates to be connected and transistors 274 and 278 represent PMOS transistors having gates to be connected.

To make all these connections, the antifuses are first programmed to make the connections for the source/-drains of all of the NMOS transistors to one wiring segment (or a set of previously connected segments). Additionally, the gate(s) of any or all of the transistors, NMOS or PMOS, which may be connected are also connected to this segment. Thus the antifuses 279-282 are programmed to make the connections to the one segment, represented by a segment 269. Then the antifuses to make the connections for the source/drains of all of the PMOS transistors to another wiring segment (or another set of previously connected segments) are programmed. Additionally, the remaining unconnected gates of NMOS or PMOS transistors are also connected. These connections are the programmed antifuses 283-286 in FIG. 29, for the connections to the other segment, represented by a segment 270.

Finally, the two segments must be connected. In FIG. 29 the two segments 269 and 270 are connected by the programming of the antifuse 268. The first segment 269 connected to the source/drain-connected NMOS transistors (represented by the transistors 279-280) is set to +10 volts, and the second segment 270 connected to the source/drain-connected PMOS transistors (represented by the PMOS transistors 275-276) is set to 0 volts. The antifuse 268 at the intersection of the two segments 269 and 270 is programmed.

For the segment 269, the source/drain-connected NMOS transistors 271 and 272 have their other source/-drains and gates set to +5 volts, $V_{pr}$, and the source/-drains of the gate-connected transistor 273 and 274 are also set to +5 volts to keep the connected transistors turned off. For the segment 270, the source/drain-connected PMOS transistors 275 and 276 have their other source/drains and gates set to +5 volts and the source/-drains of the gate-connected transistor 277 and 278 set to +5 volts. The programming connection of the source/drains of one or more NMOS transistors, the source/drains of one or more PMOS transistors, and the gates of one or more NMOS or PMOS transistors is made.

Figure 31A:
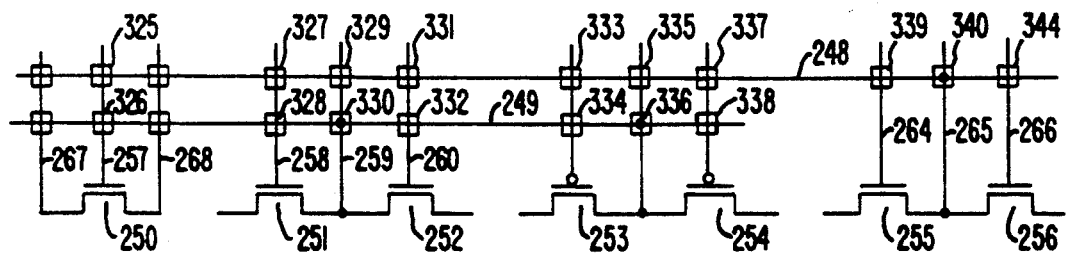
Figure 31B:
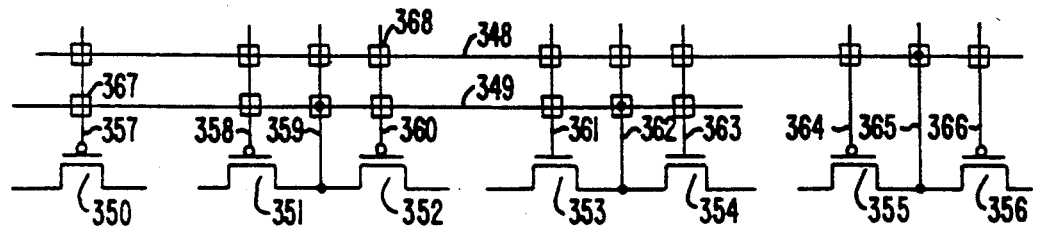

Another primary programming sequence for connecting together the source/drains of one or more NMOS transistors, the source/drains of one or more PMOS transistors, and the gates of one or more NMOS and PMOS transistors is illustrated in FIG. 31A and 31B. This rule is useful where the locations of the transistors to be connected are restricted.

In this sequence the various nets defined by the user's application must first be determined. A net is defined as a circuit node formed by programming antifuses. For each net, the gate-connected segments which are to be connected to the net are located to one side, left or right, and above or below, of all the source/drain-connected segments to be connected to the net. The source/drain-connected wiring segments are then connected to the various nets by programming the corresponding antifuses.

Figure 30:
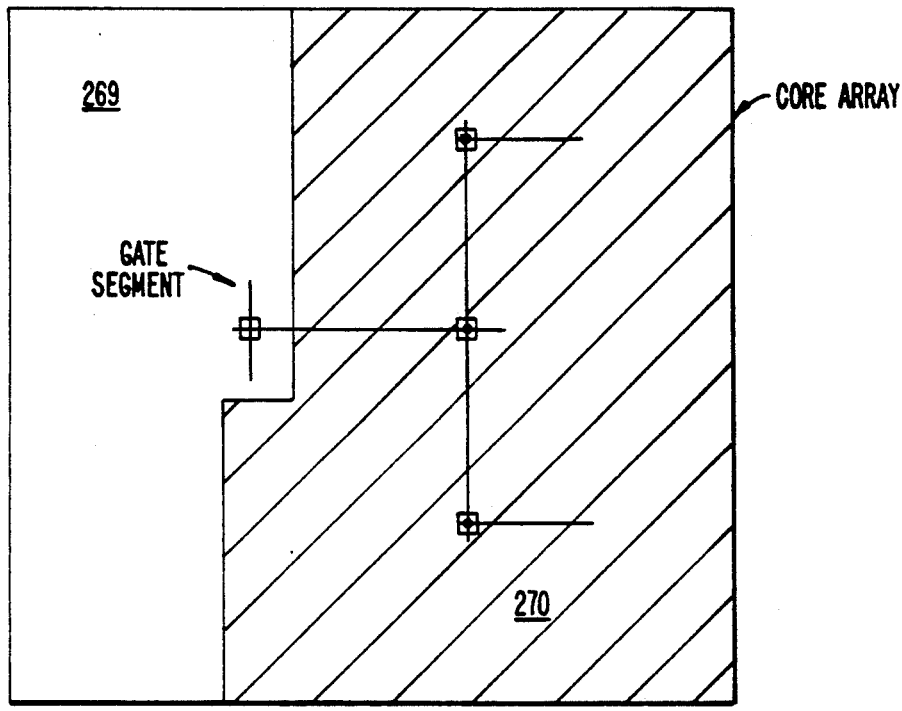
FIGS. 30, 31A and 31B illustrate a primary sequence for programming antifuses where location is restricted.

Then the gate-connected wiring segments are connected in sequence to each net in the direction toward the connected source/drain segments. The connection of the gate-connected segments in sequence is made from left to right, or right to left, and top to bottom, or bottom to top, of the array 11. The source/drain segments already connected to the net of a gate segment being connected are located to one side, as stated above, of the gate segment. During the programming of the gate segment to the net, the gate-connected segments of the transistors having their source/drains connected to the net of one side of the gate segment are driven to the programming voltages $V_{pp}$ or $V_{ss}$, as required to keep these transistors off, i.e., the source/drains of the transistors are electrically isolated and no sneak currents can flow. This is illustrated in FIG. 30. The shaded area 270 corresponds to the area in the core array 11 in which the gate segments have not yet been connected. Some of these gate segments must be set to $V_{pp}$ or $V_{ss}$ to program the antifuse successfully. Gate segments have been connected in the clear area 269; however, these connected gate segments cannot be part of the net of the gate segment being programmed.

Then the programming of the next gate-connected segment is repeated until all the gate-connected segments in the array 11 to be connected under this sequence are connected. This somewhat complex sequence of rules ensures that only the targeted antifuse is programmed and that no sneak current is generated during programming.

An illustration of this primary programming sequence is illustrated by examples with FIGS. 31A and 31B. FIG. 31A shows NMOS and PMOS transistors 250-256 which are to be connected. The connections to be made require the programming of the antifuses 326, 330, 331, 336 and 340. As stated above, the source/drain connections are first made by programming the antifuses 330, 336 and 340. These programmed antifuses are indicated by a dot within a square. Programming of the gate-connected segments can now proceed. In this example, the direction chosen for the programming of the gate-connected segments is from the left to right.

The gate-connected segment 257 is the first on the left and so the antifuse 326 is to be programmed before the antifuse 331. At this point it should be noticed that all of the source/drain-connected segments which are connected to the net of gate segment 257 are on one side of the segment, i.e., to the right of the segment 257. To program the antifuse 326, the gate segment 257 is driven to $V_{pp}$ and the intersecting segment is driven to $V_{ss}$. Since the antifuses 330 and 336 are already programmed, the common source/-drains of the transistors 251 and 252, 253 and 254, are also driven to $V_{ss}$. Representing the source/drain-connected NMOS transistors to the net of the segment 249, the transistors 251 and 252 must receive $V_{ss}$ programming voltages on their respective gate segments 258 and 260. Otherwise, the transistors 251 and 252 are turned on and sneak current paths are created from the common source/drain which had been driven to $V_{ss}$. The other wiring segments, including the gate segments 261 and 263 of the transistors 253 and 254 which represent source/drain-connected PMOS transistors on the net of the segment 249, are set at the intermediate programming voltage $V_{pr}$ without trouble. The PMOS transistors 253 and 254 are kept off.

Moving from the left to the right, the gate segment 260 is to be connected to the segment 248 by programming the antifuse 331. Again it should be noted that there are no source/drain-connected segments to the left of the gate segment 260 on the net connected to the segment 248. The source/drain connection on the net, here represented by the programmed antifuse 340, is to the right, as required.

To program the antifuse 331, the gate segment 260 is driven to $V_{pp}$ and the intersecting segment 248 to $V_{ss}$. Since the antifuse 340 is already programmed the source/drains of the transistors 255 and 256, their gate segments 264 and 266 are driven to $V_{ss}$ to keep the transistors off to prevent any sneak current paths. The other segments are left at the intermediate $V_{pr}$.

Note that if one breaks the sequence, troubles arise. For example, if one of the source/drain segments 268 of the transistor 257 had been connected to the segment 248, there would be no problem in programming the antifuse 326 as described above. However, in the next programming step for the antifuse 331, the prohibition against having source/drain connections on the net and to the left of the gate segment to be connected is violated. The source/drain segment 268 is to the left of the gate segment 260.

To program the antifuse 331, the gate segment 260 is driven to $V_{pp}$ and the segment 248 to $V_{ss}$. The source/drain connected to the segment 268 is also driven to $V_{ss}$. To keep the NMOS transistor 250 off to isolate the source/drain to prevent sneak currents, the gate segment 257 must be driven to $V_{ss}$. However, the segment 249 has already been connected to the gate segment 257 by the programmed antifuse 326. Thus the antifuse 332 which is located at the intersection of the segments 260 and 249, also receives a programming voltage of $V_{pp}$ across its terminals. This is not desirable because the antifuse had not been targeted for programming.

FIG. 31B illustrates this primary programming sequence with PMOS transistors 350-356. The procedure and sequence is the same as in the case for FIG. 31A for programming the antifuses 367 and 368. The only difference is that the programming voltages $V_{pp}$ and $V_{ss}$ are reversed.

Finally, to completely program the FPGA and its core 11 for the user's application, the two primary programming sequences described above are combined. The desired connections in the FPGA are first examined to determine what type of net is formed by the connections. A net is defined as a circuit node formed by programming antifuses. There are two types of nets: a) those nets which have routing restrictions and b) those nets which have placement restrictions. Then one programming sequence proceeds as follows:

1A. The antifuses between undedicated wiring segments, and undedicated wiring segments and LLB latch segments are programmed;
1B. On type a) nets, the antifuses to the segments connected to NMOS transistor source/drains are programmed without connecting any PMOS source/drains;
1C. On type a) nets, the antifuses to the segments connected to PMOS source/drains are programmed without connecting any NMOS source/drains;
1D. On type b) nets, the antifuses to all segments connected to source/drains (whether NMOS or PMOS transistors) are programmed;
2. The antifuses to segments to gates of transistors (whether NMOS or PMOS) are programmed in a selected direction of the array, i.e., left to right, top to bottom, etc.; and
3. On type a) nets, the antifuses between the segments connected to NMOS source/drains and the segments connected to PMOS source/drains are programmed.

Substeps 1A-1D of major step 1 may be performed in any order or simultaneously. However, the major steps of 1, 2 and 3 must be performed in order. Programming of the array is now complete.

While the above is a complete description of the preferred embodiments of the invention, various alternatives, modifications and equivalents may be used. It should be evident that the present invention is equally applicable by making appropriate modifications to the embodiments described above. For example, the circuit of the LLB may be changed or the arrangement of the address decoding of the programming transistors so that more or less of the decoding is performed at the periphery of the integrated circuit. Therefore, the above description should not be taken as limiting the scope of the invention which is defined by the metes and bounds of the appended claims.

What is claimed is:

1. A field programmable gate array integrated circuit in a semiconductor substrate, comprising an array of at least four MOS transistors, each transistor having first and second source/drains in said substrate and a gate separating said first and second source/drains, said transistors connected in series with a first source/drain of one transistor merging into a second source/drain of another transistor;

a plurality of conducting line segments, each of said first and second source/drains and each of said gates connected to one of said line segments; and a plurality of antifuses located at intersections of said conducting line segments, said conducting line segments connectable to each other at said intersections by the programming of antifuses therebetween;

whereby said array of MOS transistors are configurable into a desired circuit by programming selected antifuses.

2. The field programmable gate array as in claim 1 wherein said conducting line segments are formed on said substrate.

3. The field programmable gate array as in claim 2 wherein at least two of said conducting line segments are connected to first and second voltage supplies respectively.

4. The field programmable gate array as in claim 3 wherein said desired circuit is powered by at least one of said two conducting line segments connected to said first and second voltage supplies respectively, said desired circuit connected to at least one of said two conducting line segments through an antifuse to be programmed.

5. The field programmable gate array as in claim 4 wherein said desired circuit is powered by both of said two conducting line segments connected to said first and second voltage supplies respectively, said desired circuit connected to each of said two conducting line segments through an antifuse to be programmed.

6. The field programmable gate array as in claim 1 wherein said MOS transistors comprise MOS transistors of a first polarity and MOS transistors of a second polarity, said first polarity MOS transistors connected in series with a first source/drain of one first polarity MOS transistor merging into a second source/drain of another first polarity MOS transistor, and said second polarity MOS transistors connected in series with a first source/drain of one second polarity MOS transistor merging into a second source/drain of another second polarity MOS transistor.

7. The field programmable gate array as in claim 6 wherein said conducting line segments further comprise a first set of line segments, each first set line segment intersecting said line segments connected to one of said first and second source/drains and gates of a plurality of said first polarity MOS transistors, and intersecting said line segments connected to one of said first and second source/drains and gates of at least one of said second polarity MOS transistors, said intersecting line segments having antifuses therebetween.

8. The field programmable gate array as in claim 7 wherein said first set of line segments intersect said line segments connected to one of said first and second source/drain and gates of two of said second polarity MOS transistors.

9. The field programmable gate array as in claim 8 wherein said first set of line segments intersect said line segments connected to one of said first and second source/drain regions and gate electrodes of at least five of said first polarity MOS transistors.

10. The field programmable gate array as in claim 6 wherein said first and second polarity transistors are aligned in alternating rows in said substrate.

11. The field programmable gate array as in claim 10 wherein said conducting line segments further comprise
 a first set of line segments, each first set line segment intersecting said line segments connected to one of said first and second source/drains and gates of a plurality of transistors in a first row of said first polarity MOS transistors, and intersecting said line segments connected to one of said first and second source/drains and gates of at least one transistor in a first row of said second polarity MOS transistors, said intersecting line segments having antifuses therebetween; and
 a second set of line segments, each second set line segment parallel with said first rows of said first and second polarity MOS transistors, at least some of said first set line segments intersecting said second set line segments with antifuses therebetween.

12. The field programmable gate array as in claim 11 wherein at least two of said second set line segments are connected to first and second voltage supplies respectively.

13. The field programmable gate array as in claim 3 wherein said desired circuit is powered by at least one of said two second set line segments connected to said first and second voltage supplies respectively, said desired circuit connected to at least one of said two second set line segments through an antifuse to be programmed.

14. The field programmable gate array as in claim 13, wherein said desired circuit is powered by both of said two second set line segments connected to said first and second voltage supplies respectively, said desired circuit connected to each of said two second set line segments through an antifuse to be programmed.

15. The field programmable gate array as in claim 1 wherein said conducting line segments form a repeating pattern over said array of MOS transistors.

16. The field programmable gate array as in claim 1 further comprising an array of circuit blocks, each circuit block having at least one input signal terminal and at least one output terminal, each of said input and output signal terminals connected to one of said conducting line segments, said conducting line segments connectable to each other by an antifuse therebetween, whereby said circuit block may be configured into a desired circuit.

17. The field programmable gate array as in claim 16 wherein each circuit block has a plurality of input signal terminals and one output signal terminal.

18. An field programmable gate array integrated circuit comprising
 a plurality of conducting line segments, said conducting line segments intersecting each other and having antifuses at said intersections, said conducting line segments connectable to each other at said intersections by the programming of antifuses therebetween;
 means for programming said intersecting conducting line segments by a plurality of local decode logic circuits controlled by signals on two or more lines spanning said array in perpendicular directions, said local decode logic circuits controlling programming transistors driven by a plurality of programming wires spanning said array in perpendicular directions;
whereby a selected antifuse between a selected pair of said conducting line segments is programmed.

19. A field programmable logic array having
 a plurality of conducting lines in a first direction and a plurality of conducting lines in a second direction perpendicular to said first direction; and
 an array of circuit blocks located at the intersections of said first and second direction conducting lines and connected to said conducting lines, each of said circuit blocks also connected to wiring segments, said wiring segments interconnectable through programmable antifuses, each block configurable to perform a logic function or a latching function by selectively interconnecting said wiring segments through programming said antifuses so that said array of circuit blocks is operable jointly or separately responsive to signals upon said conducting lines.

20. The field programmable circuit array as in claim 19 wherein said circuit blocks are configured to perform latching functions so that said array of circuit blocks operates jointly as a RAM array.

21. The field programmable circuit array as in claim 19 wherein said circuit blocks are configured to perform separate logic functions from signals on said conducting lines and said wiring segments.

22. The field programmable gate array as in claim 19 wherein each circuit block is connected to three first direction conducting lines, said three first direction conducting lines carrying input signals to said circuit block, and connected to one second direction conducting line, said one first direction conducting line carrying input signals to and output signals form said circuit block.

23. The field programmable gate array as in claim 19 wherein each circuit block has three input terminals and one output terminal, each input and output terminal connected to one of said wiring segments.

24. The field programmable gate array as in claim 19 wherein each of said circuit blocks comprises
 six input terminals, three of said input terminals each connected to one of three said first direction conducting lines, the remaining three of said input terminals each connected to one of said wiring segments;

first and second output terminals, said first output terminal connected to a second direction conducting line, said second output terminal connected to a wiring segment; and means for logically combining signals from said input terminals as defined by the interconnection of said wiring segments connected to said input and output terminals to pass to said output terminals;

whereby said circuit block may be configured into different circuits.

25. The field programmable gate array as in claim 24 wherein each circuit block may be configured into a latching circuit by interconnecting wiring segments connected to one of said input terminals and said second output terminal.

26. The field programmable gate array as in claim 24 wherein said circuit blocks can be configured into latches, flip-flops, EXCLUSIVE-NOR logic gates, adders and multiplexers.

27. The field programmable gate array as in claim 24 wherein each circuit block further comprises a seventh input terminal and a MOS transistor having first and second source/drain regions and a gate electrode separating said regions, said first source/drain region connected to said first output terminal connected to said one second direction conducting line, said gate electrode connected to one of said input terminals connected to one of said first direction conducting lines, said seventh input terminal connected to said one second direction conducting line, and said second source/drain region connected to said second output terminal, whereby input signals on said one second direction conducting line may be passed to said circuit block through said seventh input terminal and output signals on said second output terminal may be passed to said one second direction conducting line responsive to signals on said one first direction conducting line.

28. An integrated circuit having an array of circuit blocks, said array comprising a plurality of conducting lines in a first direction and a plurality of conducting lines in a second direction, each of said conducting lines connected to each circuit block in said array;

a plurality of conducting line segments, said conducting line segments intersecting each other and having antifuses at said intersections, said conducting line segments connectable to each other at said intersections by the programming of antifuses therebetween; and each of said circuit blocks further connected to said conducting line segments, the operations of each of said circuit blocks defined into logic and latch functions by selectively interconnecting said conducting line segments through programmed antifuses;

whereby said circuit blocks and said array are configurable by programming selected antifuses.

29. The integrated circuit as in claim 28 wherein input and output signals may be passed to and from said circuit blocks through said first and second direction conducting lines.

30. The integrated circuit as in claim 28 wherein input signals may be passed to said circuit blocks through said connected wiring segments.

31. The integrated circuit as in claim 28 wherein output signals may be passed from said circuit blocks through said connected wiring segments.

32. The integrated circuit as in claim 28 wherein said circuit blocks are configured to perform latching functions so that said array of circuit blocks operates as a RAM array.

33. A field programmable gate array integrated circuit, comprising a plurality of conducting line segments, said conducting line segments intersecting each other and having antifuses at said intersections, said conducting line segments connectable to each other at said intersections by programmed antifuses therebetween;

a plurality of programming transistors, each conducting line segment connected to one of said programming transistors selectively activated by local decode logic circuits responsive to control lines spanning said array in perpendicular directions;

a plurality of programming wires spanning said array in perpendicular directions, each programming transistor selectively driven through one of said programming wires;

whereby an antifuse between a first and second conducting line segment is programmed by selectively activating programming transistors connected to said first and second conducting line segments and selectively driving said programming transistors connected to said first and second conducting line segments.

34. The field programmable gate array as in claim 33 wherein each of said programming transistors have a first and second source/drain region, and a gate electrode, said local decode logic is connected to gate electrodes of said programming transistors.

35. The field programmable gate array as in claim 34 wherein said conducting line segments are connected to said first source/drain regions of said programming transistors.

36. The field programmable gate array as in claim 34 wherein said programming wires are connected to first source/drain regions of said programming transistors.

37. The field programmable gate array as in claim 36 wherein said programming transistors comprise a first and second set of programming transistors; and wherein said programming wires comprise a first and second set of programming wires, said first set of programming wires selectively driven to a first programming voltage and associated with said first set of programming transistors so that a conducting line segment connected to a selectively activated first set programming transistor may be selectively driven to said first programming voltage, and said second set of programming wires selectively driven to a second programming voltage and associated with said second set of programming transistors so that a conducting line segment connected to a selectively activated second set programming transistor may be selectively driven to said second programming voltage.

38. The field programmable gate array as in claim 37 wherein said local decode logic circuits comprises a first decoding circuit responsive to address signals for generating a voltage on a gate electrode of a selected first set programming transistor; and a second decoding circuit responsive to said address signals for generating a voltage on a gate electrode of a selected second set programming transistor.

39. The field programmable gate array as in claim 38 further comprising a third decoding circuit responsive to said address signals for providing for the selective connection of a first set programming wire to a voltage supply at said first programming voltage; and a fourth decoding circuit responsive to said address signals for providing for the selective connection of a second set programming wire to a voltage supply at said second programming voltage.

40. The field programmable gate array as in claim 37 wherein each conducting line segment is connected to a first set programming transistor and to a second set programming transistor.

41. The field programmable gate array as in claim 36 wherein said first set programming transistors comprise MOS transistors of a first conductivity type and said second set programming transistors comprise MOS transistors of a second conductivity type.

42. The field programmable gate array as in claim 41 wherein said first set programming transistors comprise PMOS transistors and said second set programming transistors comprise a NMOS transistor, and said first programming voltage is positive with respect to said second programming voltage.

* * * * *